US012796062B2

(12) United States Patent
Mehrotra et al.

(10) Patent No.: US 12,796,062 B2
(45) Date of Patent: Nov. 10, 2026

(54) HIGH MOBILITY TRANSISTORS

(71) Applicant: Texas Instruments Incorporated, Dallas, TX (US)

(72) Inventors: Manoj Mehrotra, Bangalore (IN); Charles Frank Machala, III, Plano, TX (US); Rick L. Wise, Fairview, TX (US); Hiroaki Niimi, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 781 days.

(21) Appl. No.: 17/202,978

(22) Filed: Mar. 16, 2021

(65) Prior Publication Data

US 2021/0225711 A1 Jul. 22, 2021

Related U.S. Application Data

(60) Continuation of application No. 16/206,045, filed on Nov. 30, 2018, now Pat. No. 10,978,353, which is a (Continued)

(51) Int. Cl.
*H10D 84/03* (2025.01)
*H10B 10/00* (2023.01)

(Continued)

(52) U.S. Cl.
CPC .......... *H10D 84/038* (2025.01); *H10B 10/12* (2023.02); *H10B 10/18* (2023.02); *H10D 30/62* (2025.01); *H10D 30/751* (2025.01); *H10D 62/83* (2025.01); *H10D 62/832* (2025.01); *H10D 62/85* (2025.01); *H10D 84/0158* (2025.01);

(Continued)

(58) Field of Classification Search
CPC ......... H01L 21/823821; H01L 27/0924; H01L 21/823878; H01L 27/0922; H01L 21/823807; H01L 21/02546; H10D 30/62; H10D 84/0158; H10D 84/0193;

(Continued)

(56) References Cited

U.S. PATENT DOCUMENTS 7,145,167 B1 * 12/2006 Chu .................... H10D 30/015
257/E21.403
7,719,043 B2 * 5/2010 Yamagami ......... H10D 84/0167
438/176

(Continued)

*Primary Examiner* — Aaron J Gray
(74) *Attorney, Agent, or Firm* — Yudong Kim; Charles F. Koch

(57) ABSTRACT

An integrated circuit containing an n-channel finFET and a p-channel finFET is formed by forming a first polarity fin epitaxial layer for a first polarity finFET, and subsequently forming a hard mask which exposes an area for a second, opposite, polarity fin epitaxial layer for a second polarity finFET. The second polarity fin epitaxial layer is formed in the area exposed by the hard mask. A fin mask defines the first polarity fin and second polarity fin areas, and a subsequent fin etch forms the respective fins. A layer of isolation dielectric material is formed over the substrate and fins. The layer of isolation dielectric material is planarized down to the fins. The layer of isolation dielectric material is recessed so that the fins extend at least 10 nanometers above the layer of isolation dielectric material. Gate dielectric layers and gates are formed over the fins.

22 Claims, 24 Drawing Sheets

Related U.S. Application Data continuation of application No. 15/292,373, filed on Oct. 13, 2016, now Pat. No. 10,163,725, which is a division of application No. 14/572,949, filed on Dec. 17, 2014, now Pat. No. 9,496,262.

(60) Provisional application No. 61/921,454, filed on Dec. 28, 2013.

(51) Int. Cl.

| | |
|---|---|
| ***H10D 30/62*** | (2025.01) |
| ***H10D 30/69*** | (2025.01) |
| ***H10D 62/83*** | (2025.01) |
| ***H10D 62/832*** | (2025.01) |
| ***H10D 62/85*** | (2025.01) |
| ***H10D 84/01*** | (2026.01) |
| ***H10D 84/85*** | (2025.01) |
| ***H10P 14/20*** | (2026.01) |

(52) U.S. Cl.

CPC ..... *H10D 84/0167* (2025.01); *H10D 84/0188* (2025.01); *H10D 84/0193* (2025.01); *H10D 84/853* (2025.01); *H10D 84/856* (2025.01); *H10P 14/2905* (2026.01); *H10P 14/3211* (2026.01); *H10P 14/3411* (2026.01); *H10P 14/3418* (2026.01); *H10P 14/3421* (2026.01)

(58) Field of Classification Search

CPC .. H10D 84/853; H10D 84/856; H10D 62/832; H10D 62/85

See application file for complete search history.

(56) References Cited

U.S. PATENT DOCUMENTS

| | | | | |
|---|---|---|---|---|
| 8,481,410 | B1 | 7/2013 | LiCausi et al. | |
| 2009/0008716 | A1* | 1/2009 | Goto .................. | H10D 84/0128 257/E27.06 |
| 2012/0319211 | A1* | 12/2012 | van Dal ............... | H10D 30/024 257/E21.09 |
| 2013/0052781 | A1 | 2/2013 | Dai et al. | |
| 2013/0168771 | A1 | 7/2013 | Wu et al. | |
| 2013/0224936 | A1* | 8/2013 | Lee .................... | H10D 84/0158 438/492 |
| 2014/0001519 | A1 | 1/2014 | Dewey et al. | |
| 2014/0011341 | A1 | 1/2014 | Maszara et al. | |
| 2014/0027860 | A1* | 1/2014 | Glass ................... | H10D 30/751 257/E27.06 |
| 2014/0217467 | A1* | 8/2014 | Pawlak .................. | H10D 62/81 438/478 |
| 2014/0252413 | A1 | 9/2014 | Utomo et al. | |
| 2014/0252479 | A1 | 9/2014 | Utomo et al. | |
| 2014/0374797 | A1* | 12/2014 | Kwon .................. | H10D 30/021 257/190 |
| 2015/0054078 | A1 | 2/2015 | Xie et al. | |

* cited by examiner

HIGH MOBILITY TRANSISTORS

CROSS-REFERENCE TO RELATED APPLICATIONS

This application is a continuation of U.S. patent application Ser. No. 16/206,045, filed Nov. 30, 2018, which is a continuation of U.S. patent application Ser. No. 15/292,373, filed Oct. 13, 2016 (now U.S. Pat. No. 10,163,725), which is a divisional of U.S. patent application Ser. No. 14/572,949, filed Dec. 17, 2014 (now U.S. Pat. No. 9,496,262), which claims the benefit of U.S. Provisional Application No. 61/921,454, filed Dec. 28, 2013, all of which are incorporated herein by reference in their entirety.

FIELD OF THE INVENTION

This invention relates to the field of integrated circuits. More particularly, this invention relates to fin field effect transistors (finFETs) in integrated circuits.

BACKGROUND OF THE INVENTION

Integrated circuits having fin field effect transistors (finFETs) attain high gate density, but lack transistor performance offered by planar transistors using high mobility materials such as III-V materials or germanium. Integrating high mobility materials into high density integrated circuits has been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing an n-channel fin field effect transistor (finFET) and a p-channel finFET may be formed by forming a first polarity (e.g., p-channel) fin epitaxial layer in a first area and forming a second polarity (e.g., n-channel) fin epitaxial layer in a second area. A fin mask is formed over the first polarity fin epitaxial layer and the second polarity fin epitaxial layer to define areas for an p-channel fin and a n-channel fin. A fin etch process removes epitaxial material in areas exposed by the fin mask to leave the n-channel fin and the p-channel fin. An isolation oxide layer is formed over the n-channel fin and the p-channel fin. A planarizing process planarizes the isolation oxide layer proximate to top surfaces of the n-channel fin and the p-channel fin. The isolation oxide layer is recessed by a subsequent etchback process, exposing the n-channel fin and the p-channel fin. Gate dielectric layers and gates are formed over the exposed n-channel fin and the p-channel fin.

DETAILED DESCRIPTION OF EXAMPLE EMBODIMENTS

Figure 1:
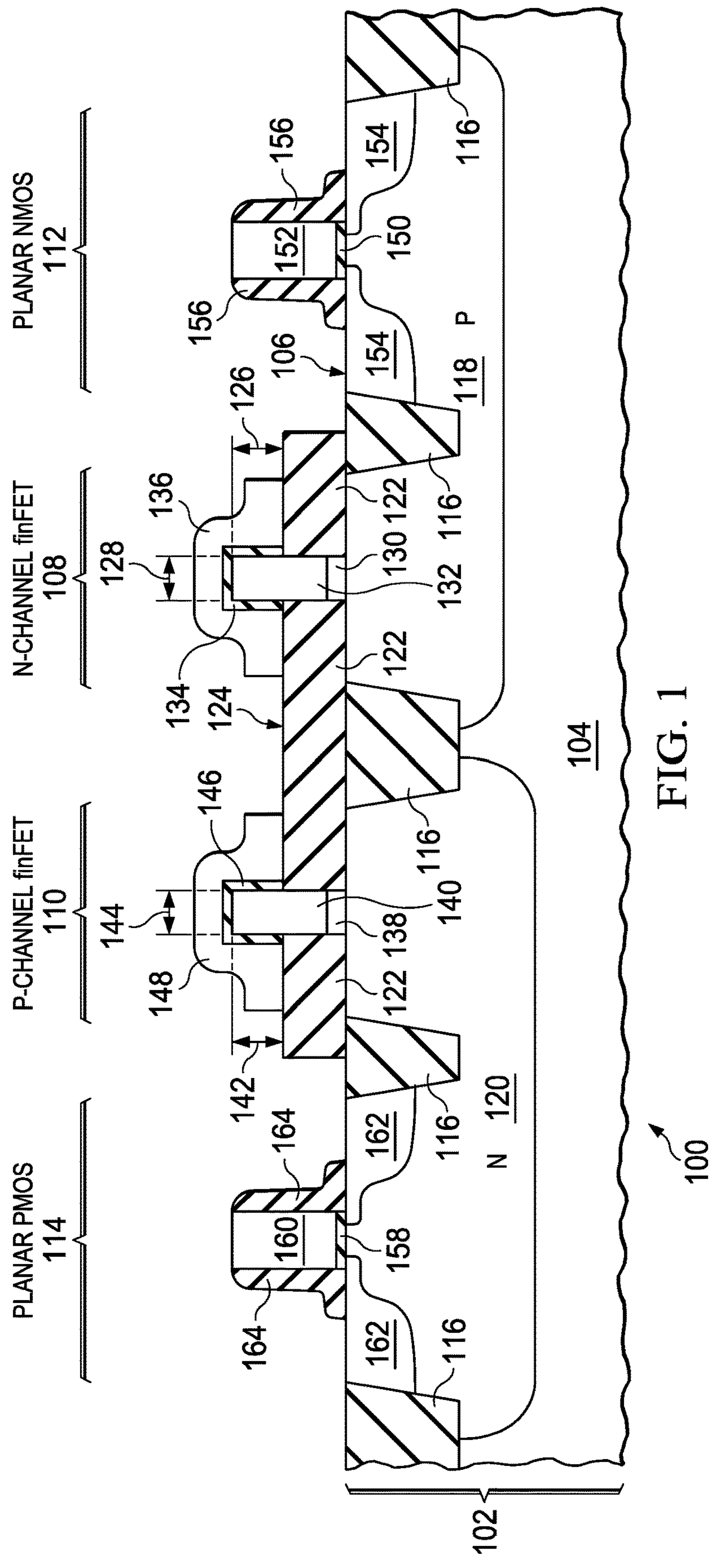
FIG. 1 is a cross section of an example integrated circuit containing an n-channel finFET and a p-channel finFET.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an n-channel finFET and a p-channel finFET may be formed by forming a first fin epitaxial layer for a first polarity finFET, and subsequently forming a hard mask which exposes an area for a second fin epitaxial layer for a second, opposite, polarity finFET. The integrated circuit may be formed by two example process sequences. In the first sequence, a first hard mask is formed over a substrate comprising silicon so as to expose an area for the p-channel finFET and cover an area for the n-channel finFET. A p-channel fin epitaxial layer is formed in the area exposed by the first hard mask. The first hard mask is removed and a second hard mask is formed which exposes the area for the n-channel finFET and covers the p-channel fin epitaxial layer. An n-channel fin epitaxial layer is formed in the area exposed by the second hard mask. The second hard mask is removed. Alternatively, the p-channel fin epitaxial layer may be formed after the n-channel fin epitaxial layer using an analogous process sequence. A fin mask is formed over the p-channel fin epitaxial layer and the n-channel fin epitaxial layer to define areas for an n-channel fin and a p-channel fin, respectively. A fin etch process removes epitaxial material in areas exposed by the fin mask to leave the n-channel fin and the p-channel fin. An isolation oxide layer is formed over the n-channel fin and the p-channel fin. A planarizing process planarizes the isolation oxide layer proximate to top surfaces of the n-channel fin and the p-channel fin. The isolation oxide layer is recessed by a subsequent etchback process, exposing the n-channel fin and the p-channel fin. Gate dielectric layers and gates are formed over the exposed n-channel fin and the p-channel fin.

The integrated circuit may also be formed by forming the p-channel fin epitaxial layer over exposed areas of the substrate. A hard mask is formed over the p-channel fin epitaxial layer so as to expose the area for the n-channel finFET and cover the area for the p-channel finFET. An etch process removed at least a portion of the p-channel fin epitaxial layer in areas exposed by the hard mask. The n-channel fin epitaxial layer is formed over exposed areas of the substrate in the area exposed by the second hard mask. The hard mask is subsequently removed. Alternatively, the p-channel fin epitaxial layer may be formed after the n-channel fin epitaxial layer using an analogous process sequence. The fin mask is formed and the fin etch process forms the n-channel fin and the p-channel fin. The recessed isolation oxide layer is formed so as to expose the -channel fin and the p-channel fin, and the gate dielectric layers and gates are formed over the exposed n-channel fin and the p-channel fin.

FIG. 1 is a cross section of an example integrated circuit containing an n-channel finFET and a p-channel finFET. The integrated circuit 100 is formed on a substrate 102 including crystalline semiconductor material 104 which includes crystalline silicon extending to a top surface 106 of the substrate 102. The substrate 102 may be, for example, a bulk silicon wafer, an epitaxial silicon wafer, or a silicon-on-insulator (SOI) wafer. The integrated circuit 100 includes an n-channel finFET 108 and a p-channel finFET 110. The integrated circuit 100 may optionally include a planar n-channel metal oxide semiconductor (NMOS) transistor 112 and a planar p-channel metal oxide semiconductor (PMOS) transistor 114. The integrated circuit 100 may optionally include field oxide 116 to laterally separate the n-channel finFET 108 and the p-channel finFET 110, and to laterally separate the planar NMOS transistor 112 and the planar PMOS transistor 114, if present. The n-channel finFET 108 and the planar NMOS transistor 112 are disposed on a p-type region 118 of the substrate 102, which may be a p-type well 118 as shown in FIG. 1. The p-channel finFET 110 and the planar PMOS transistor 114 are disposed on an n-type region 120 of the substrate 102, which may be an n-type well 120 as shown in FIG. 1. An isolation dielectric layer 122 is disposed over the substrate 102 in areas for the n-channel finFET 108 and the p-channel finFET 110. The isolation dielectric layer 122 may be 20 nanometers to 40 nanometers thick, and may include one or more layers of silicon dioxide and/or boron phosphorus silicate glass (BPSG), and possibly other dielectric material such as silicon oxynitride.

The n-channel finFET 108 includes a first buffer 130 of germanium-containing semiconductor material on the top surface 106 of the substrate 102, and an n-channel fin 132 on the first buffer 130, extending above a top surface 124 of the isolation dielectric layer 122 by a first exposure height 126 of at least 10 nanometers. The first buffer 130 may be 1 nanometer to 5 nanometers thick, and include, for example, substantially all germanium, or may include a mixture of silicon-germanium. A germanium atomic fraction of the first buffer 130 may be graded so that the germanium atomic fraction at a bottom surface of the first buffer 130, contacting the substrate 102, may be less than 20 percent and the germanium atomic fraction at a top surface of the first buffer 130, contacting the n-channel fin 132, may be greater than 80 percent. The n-channel fin 132 includes semiconductor material different from silicon, possibly having a higher electron mobility than silicon, which may advantageously provide a desired on-state current for the n-channel finFET 108 higher than a corresponding finFET with a silicon fin. The n-channel fin 132 may include, for example gallium arsenide, indium gallium arsenide with an indium to gallium ratio of 50:50 to 57:43, indium phosphide, germanium or silicon-germanium with a germanium atomic fraction greater than 80 percent. The first exposure height 126 may be 20 nanometers to 40 nanometers. A first width 128 of the n-channel fin 132 above the top surface 124 of the isolation dielectric layer 122 may be less than 30 nanometers, for example 10 nanometers to 20 nanometers. The isolation dielectric layer 122 surrounds the first buffer 130 and a lower portion of the n-channel fin 132. The n-channel finFET 108 includes a first gate dielectric layer 134 disposed over the n-channel fin 132, and a first gate 136 disposed over the first gate dielectric layer 134. The first gate 136 may include polycrystalline silicon, referred to as polysilicon, metal silicide or metal gate material.

The p-channel finFET 110 may include an optional germanium-containing second buffer 138 2 nanometers to 5 nanometers thick on the top surface 106 of the substrate 102. The p-channel finFET 110 includes a p-channel fin 140 on the second buffer 138 if present, or on the substrate 102 if the second buffer 138 is not present. The p-channel fin 140 extends above the top surface 124 of the isolation dielectric layer 122 by a second exposure height 142 of at least 10 nanometers. The p-channel fin 140 includes semiconductor material different from silicon and different from the n-channel fin 132, possibly having a higher hole mobility than silicon, which may advantageously provide a desired on-state current for the p-channel finFET 110 higher than a corresponding finFET with a silicon fin. The p-channel fin 140 may include, for example, germanium or silicon-germanium with a germanium atomic fraction greater than 80 percent. The second exposure height 142 may be 20 nanometers to 40 nanometers. A second width 144 of the p-channel fin 140 above the top surface 124 of the isolation dielectric layer 122 may be less than 30 nanometers, and may be substantially equal to the first width 128 of the n-channel fin 132. The isolation dielectric layer 122 surrounds the second buffer 138 if present and a lower portion of the p-channel fin 140. The p-channel finFET 110 includes second gate dielectric layer 146 disposed over the p-channel fin 140, and a second gate 148 disposed over the second gate dielectric layer 146. The second gate 148 may include polysilicon, metal silicide or metal gate material. The n-channel finFET 108 and the p-channel finFET 110 may be part of a logic circuit, or may be part of a memory cell such as a static random access memory (SRAM) cell, advantageously providing higher speed and higher density compared to logic circuits or memory cells of planar MOS transistors.

The planar NMOS transistor 112 includes a third gate dielectric layer 150 disposed over the substrate 102 and an NMOS gate 152 disposed over the third gate dielectric layer 150. N-type source/drain regions 154 are disposed in the substrate 102 adjacent to, and extending partway under, the NMOS gate 152. Sidewall spacers 156 may be disposed adjacent to the NMOS gate 152. The planar PMOS transistor 114 includes a fourth gate dielectric layer 158 disposed over the substrate 102 and a PMOS gate 160 disposed over the fourth gate dielectric layer 158. P-type source/drain regions 162 are disposed in the substrate 102 adjacent to, and extending partway under, the PMOS gate 160. Sidewall spacers 164 may be disposed adjacent to the PMOS gate 160. The planar NMOS transistor 112 and the planar PMOS transistor 114 may be part of an input/output (I/O) circuit, and may operate at a higher voltage than the n-channel finFET 108 and the p-channel finFET 110.

Figure 2A:
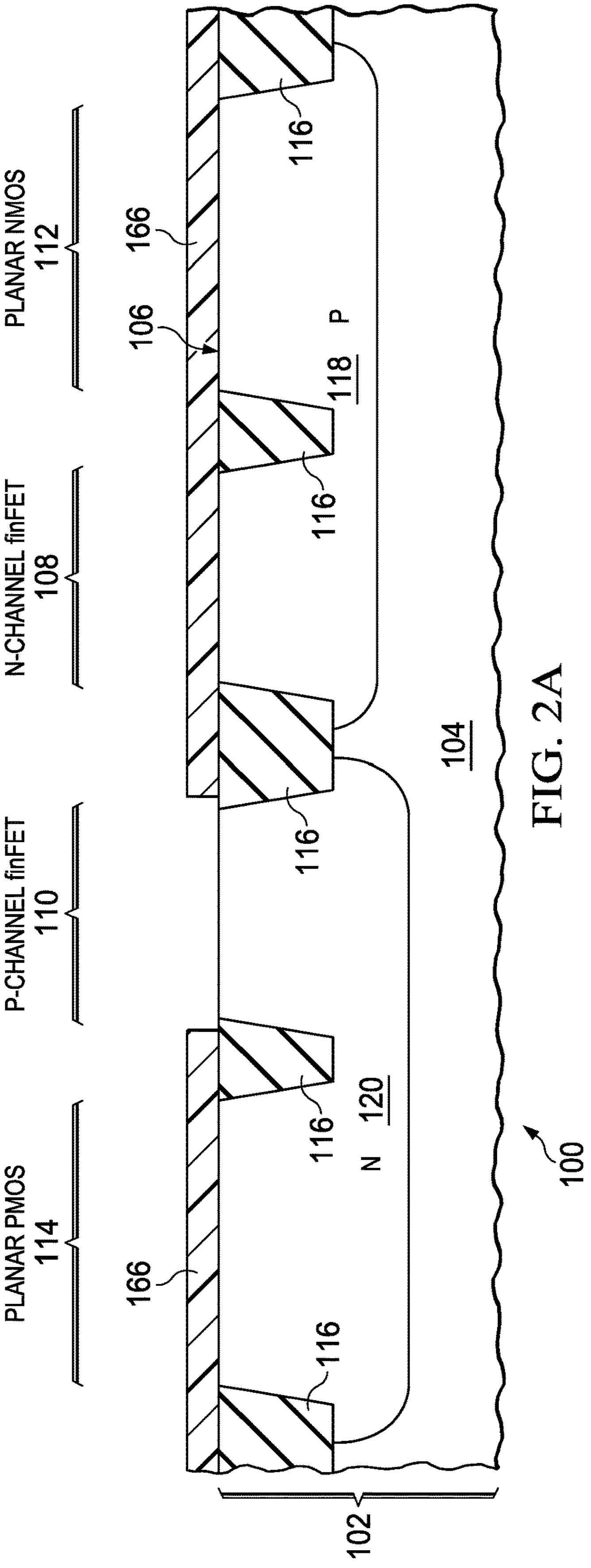
FIG. 2A through FIG. 2O are cross sections of the integrated circuit of FIG. 1, depicted in successive stages of an example fabrication process sequence.
Figure 2B:
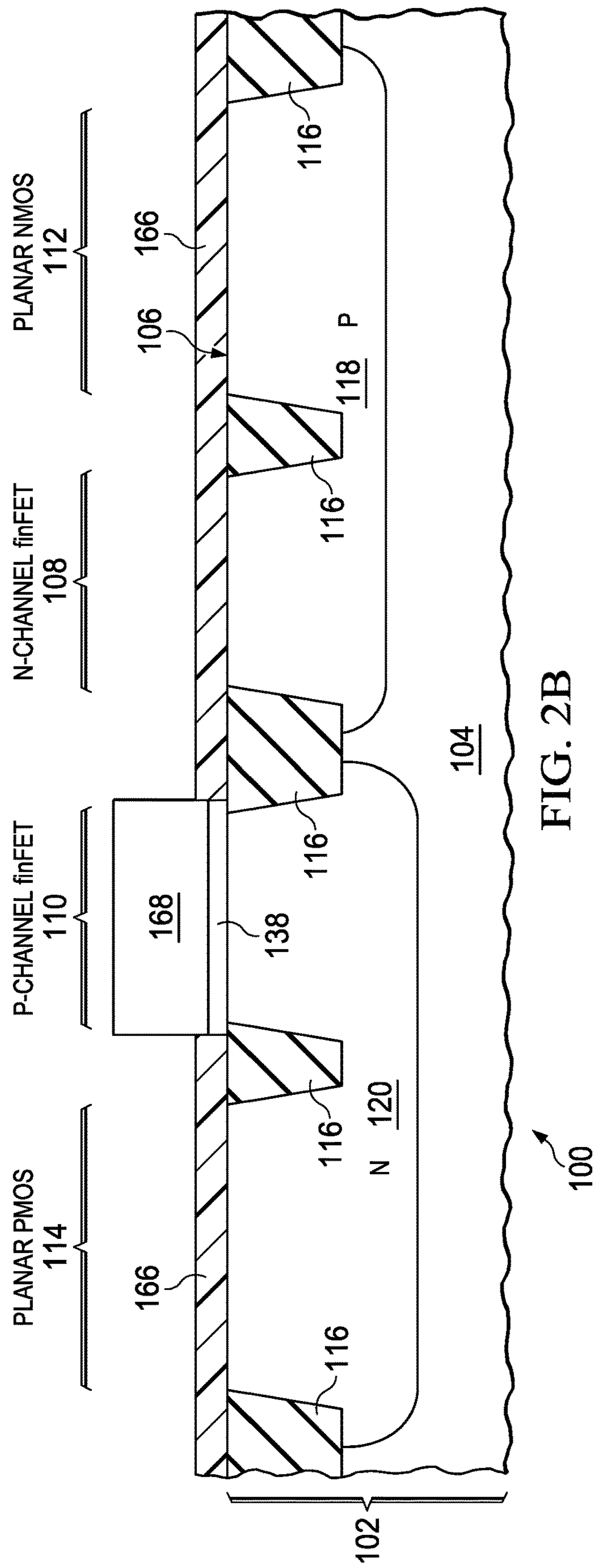
Figure 2C:
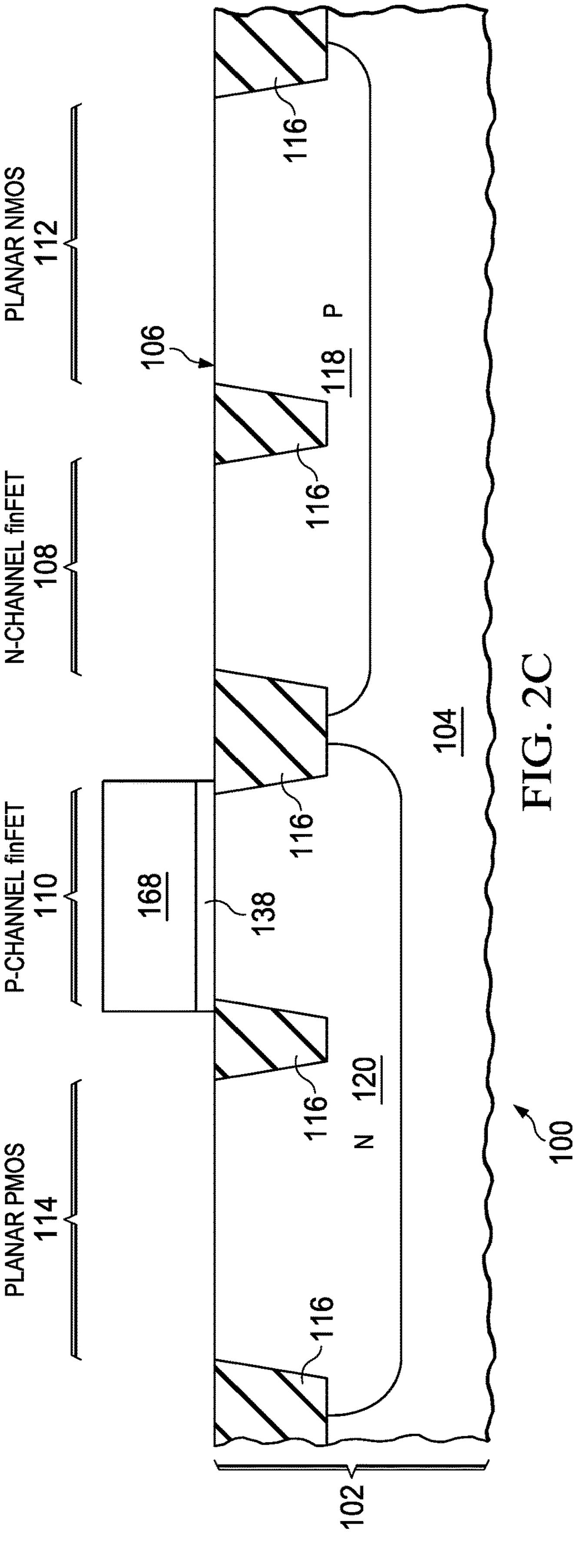
Figure 2D:
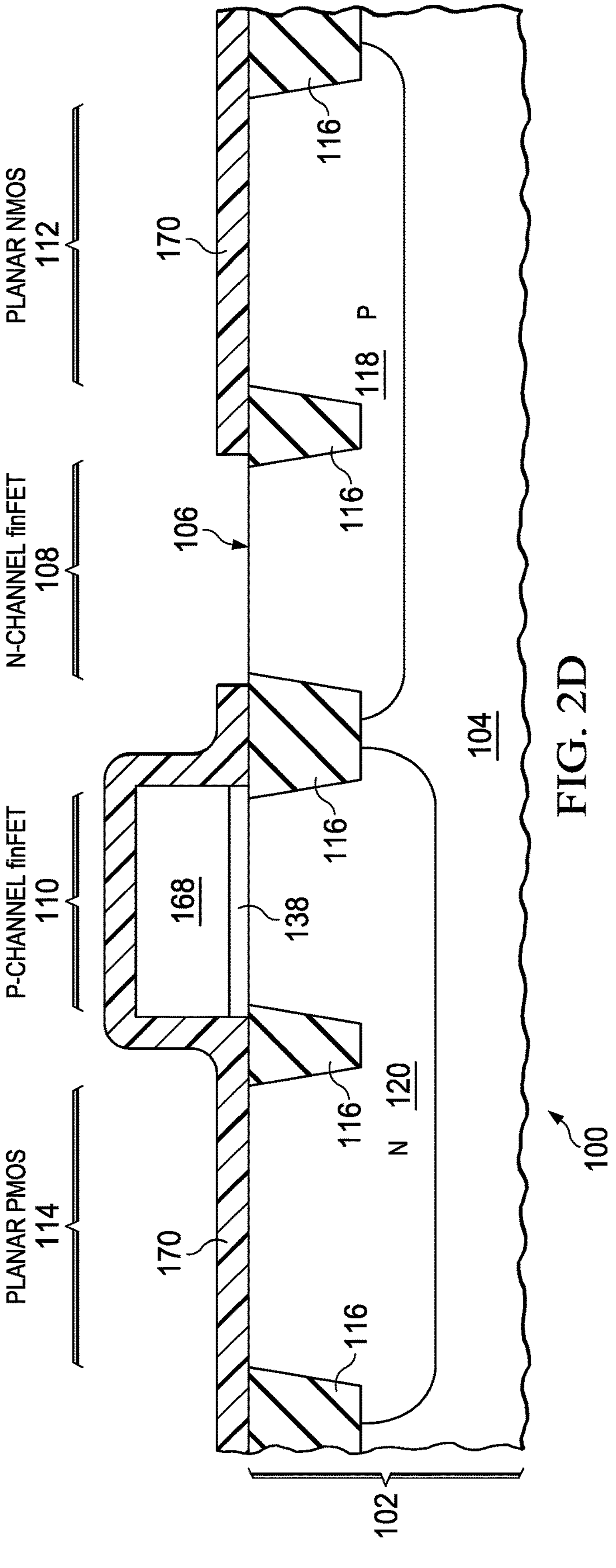
Figure 2E:
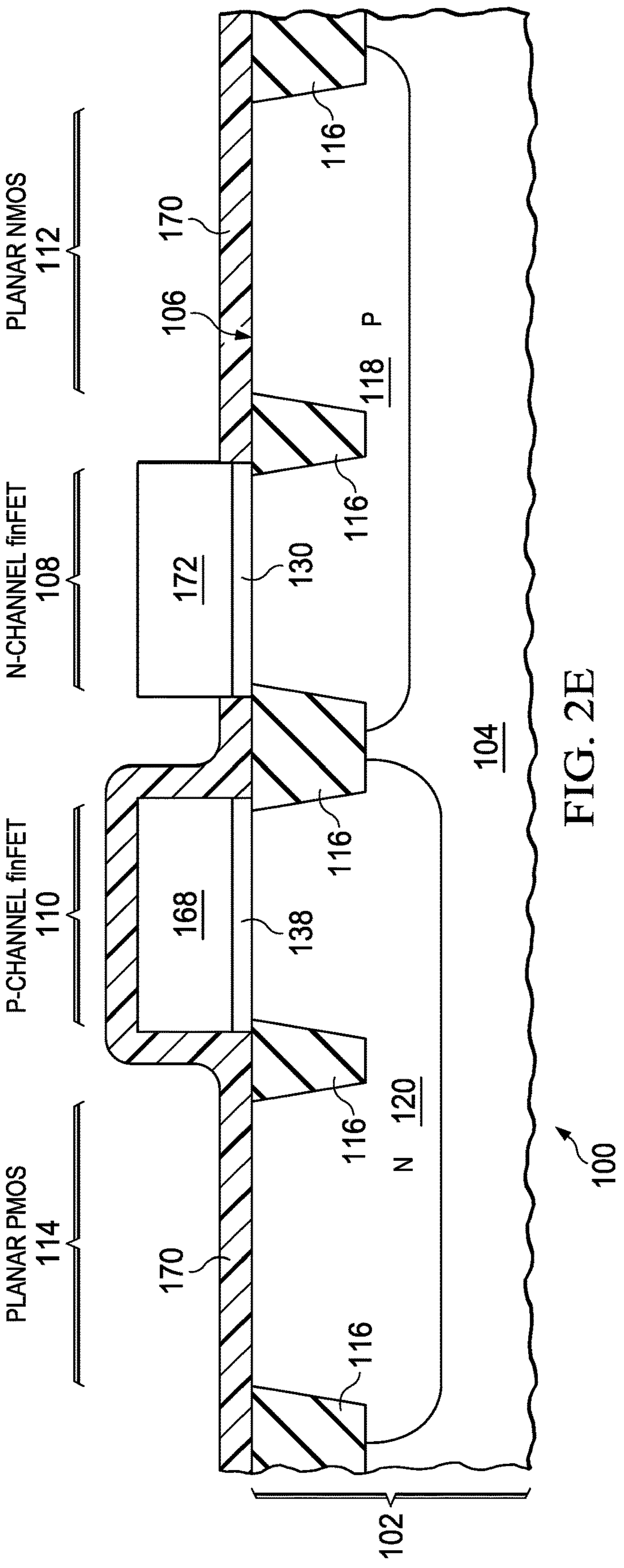
Figure 2F:
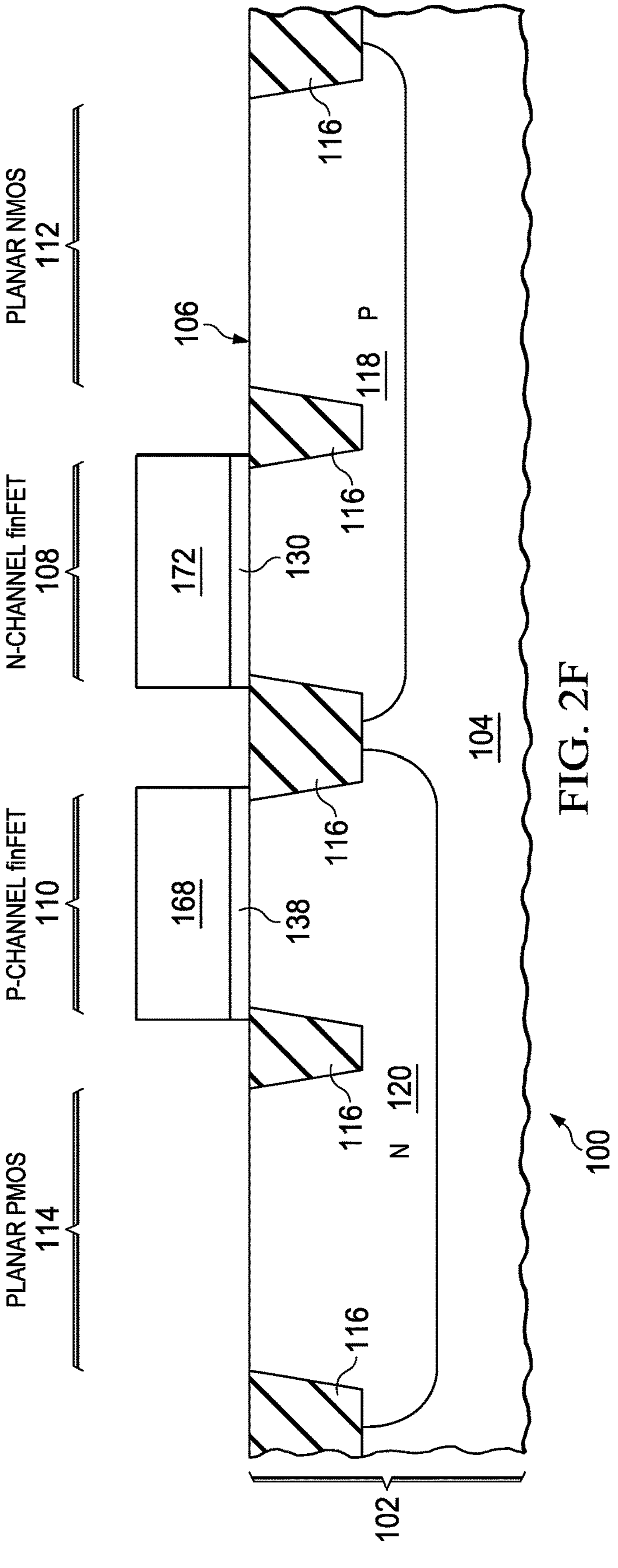
Figure 2G:
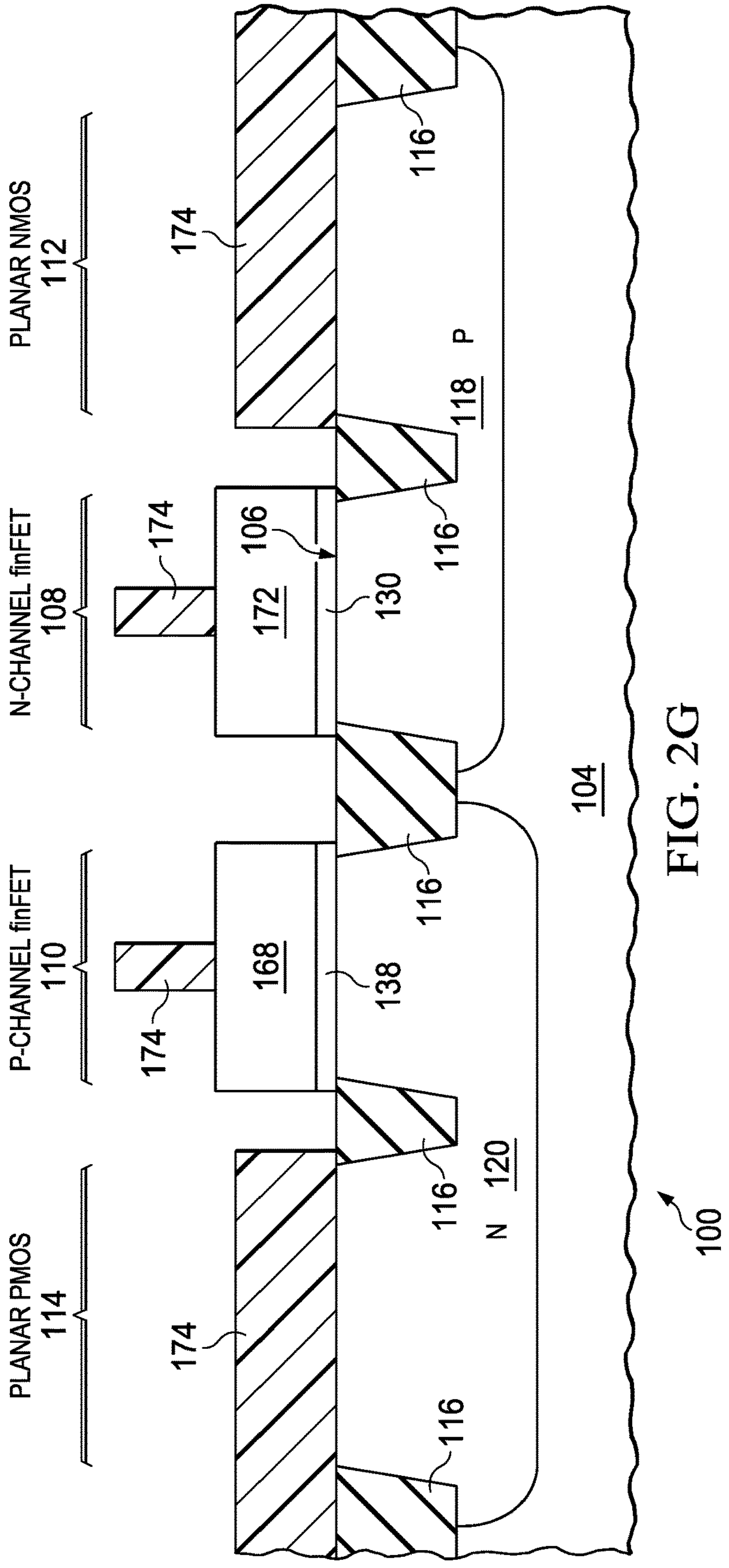
Figure 2H:
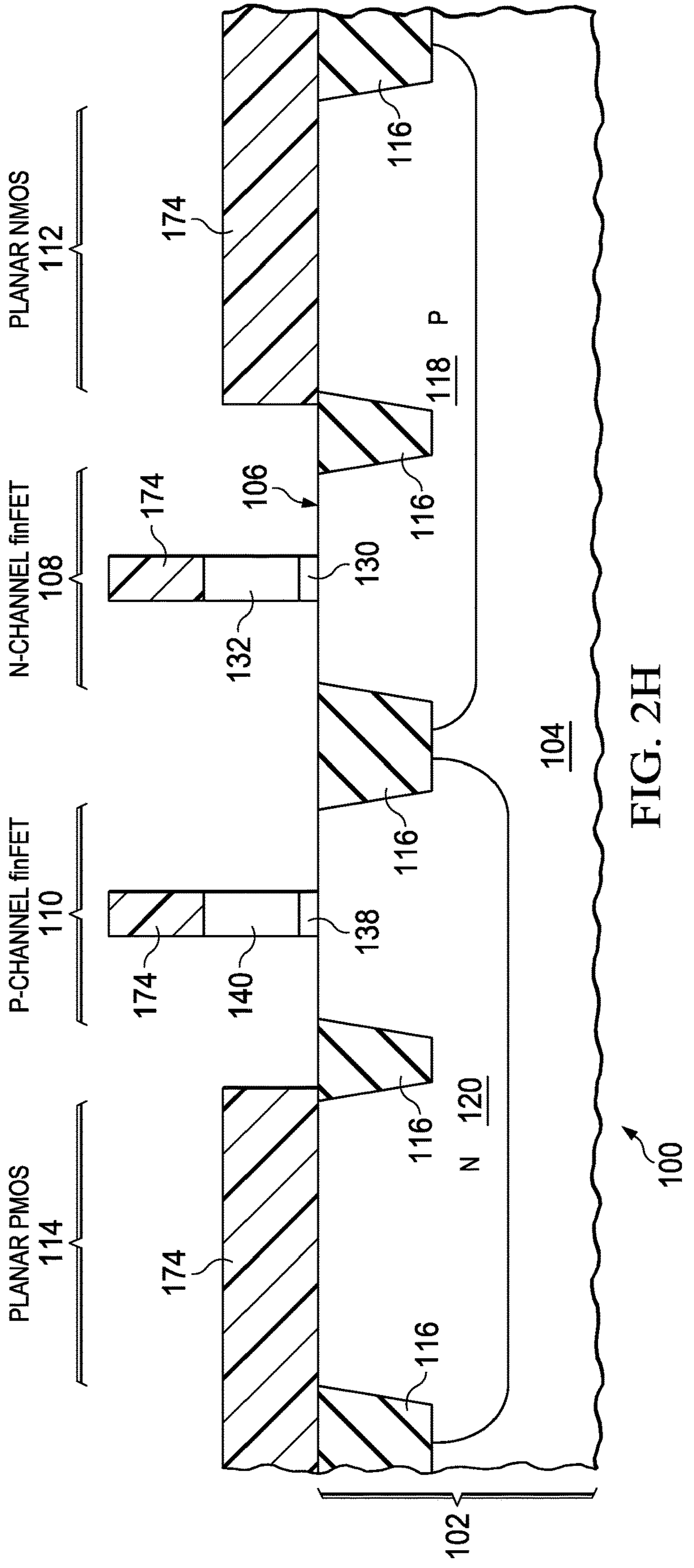
Figure 2I:
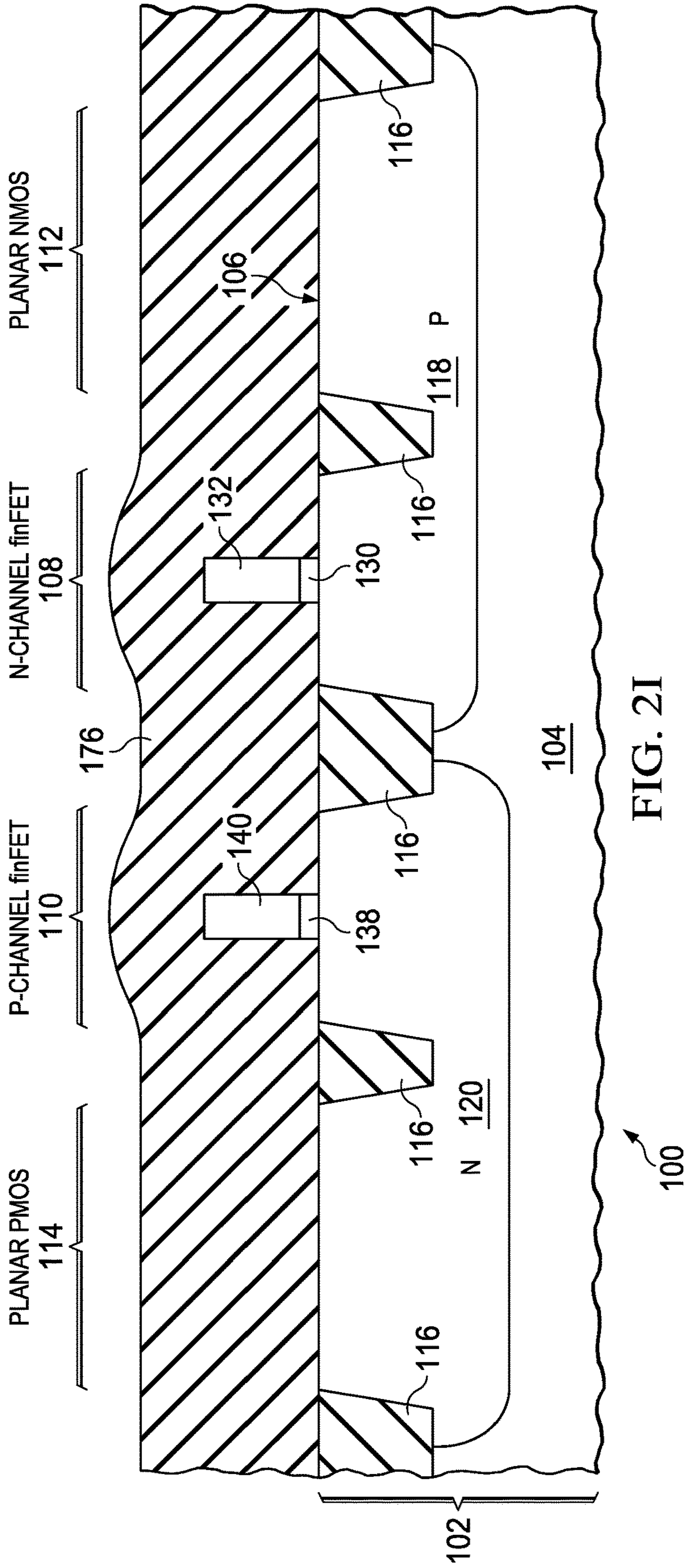
Figure 2J:
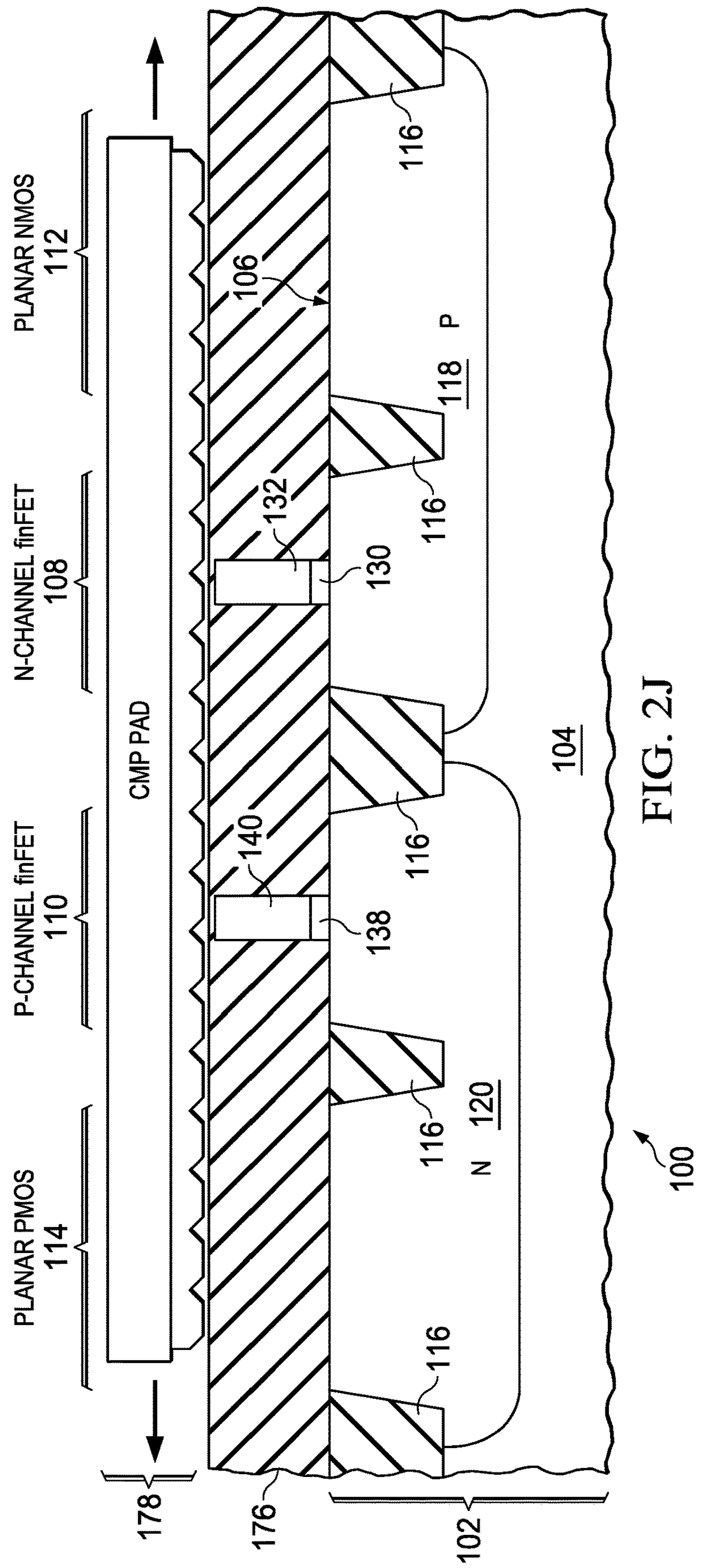
Figure 2K:
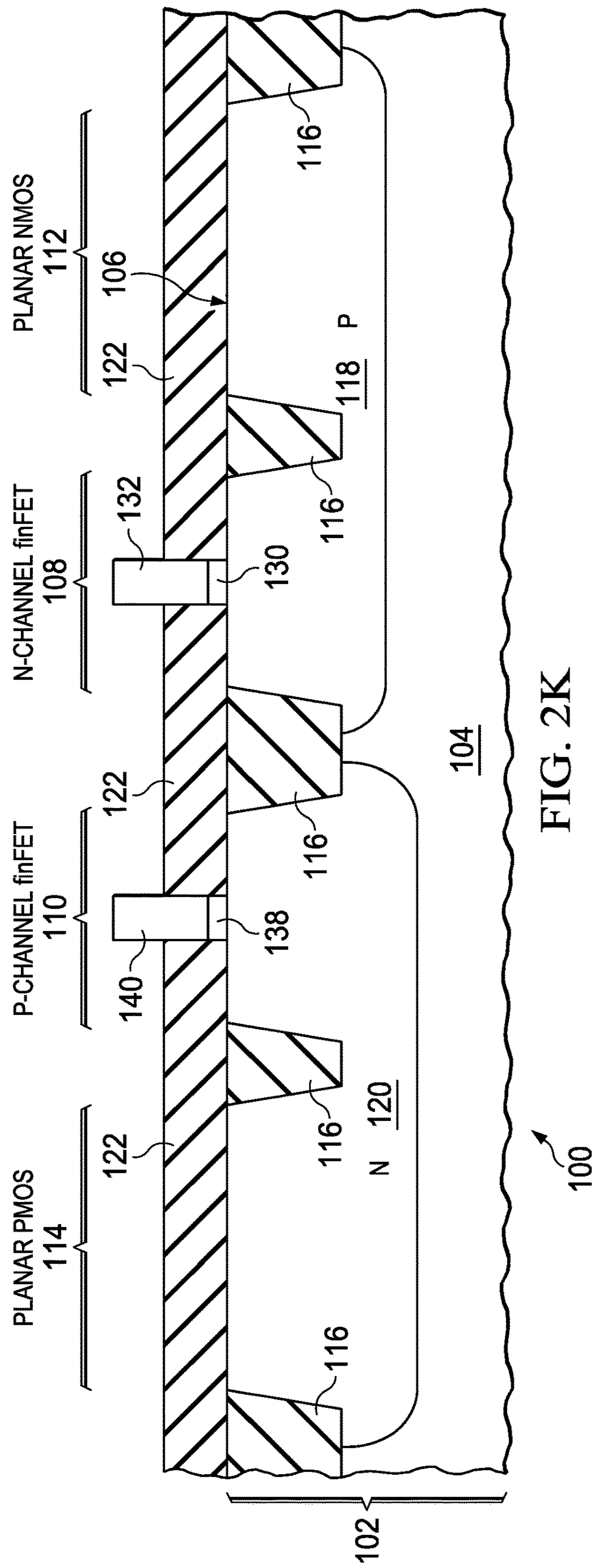
Figure 2L:
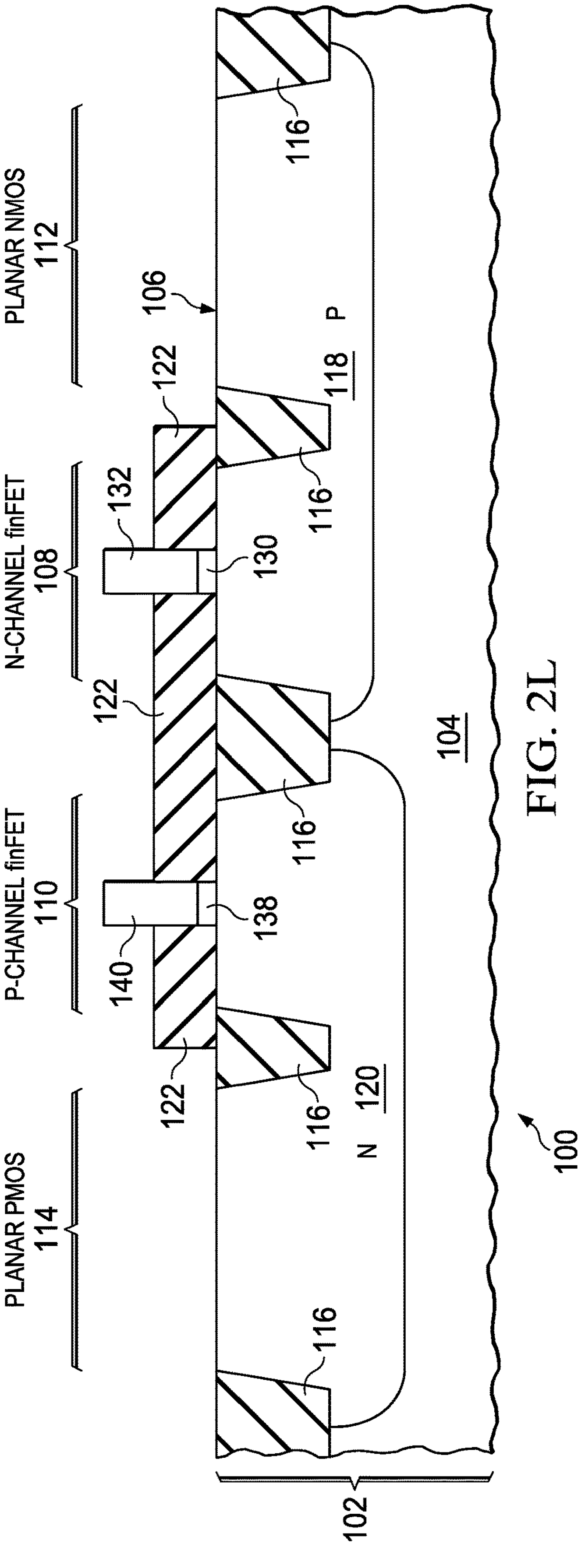
Figure 2M:
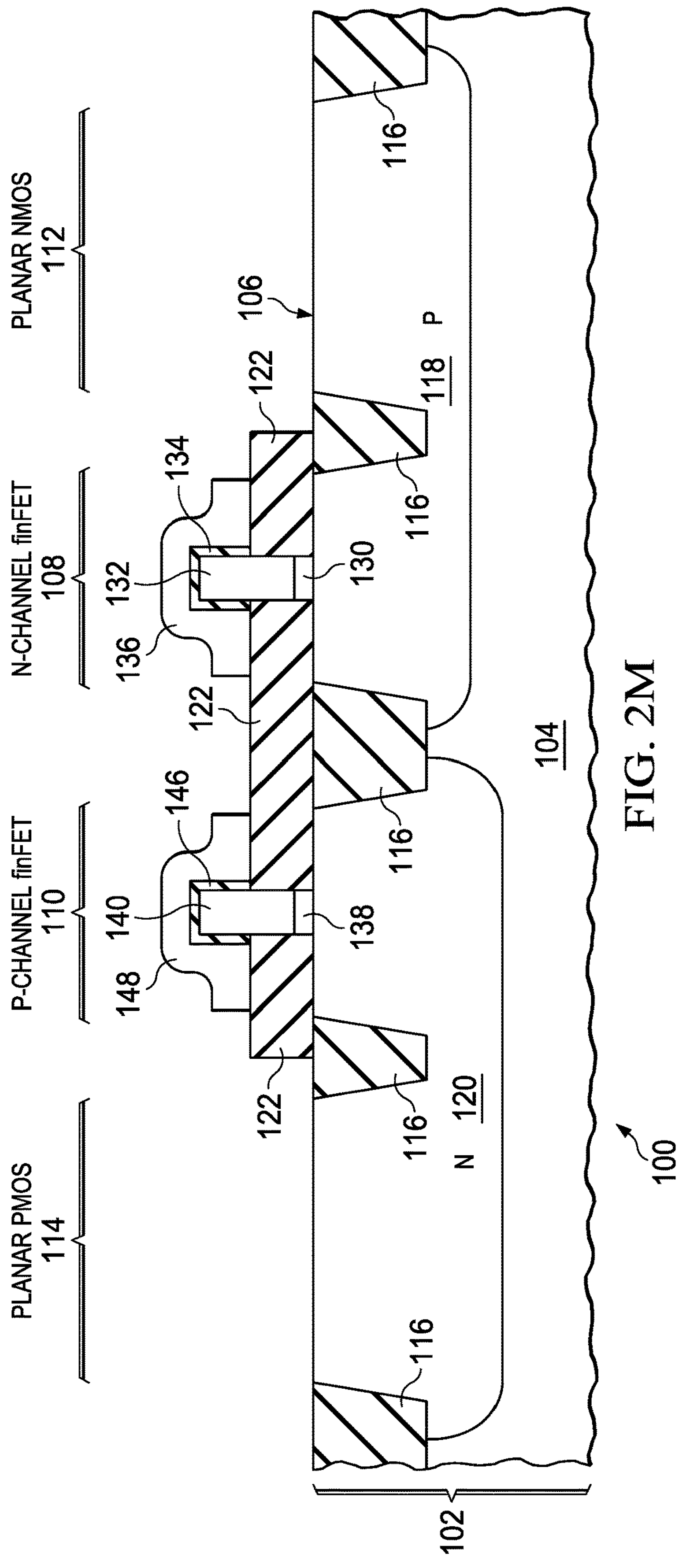
Figure 2N:
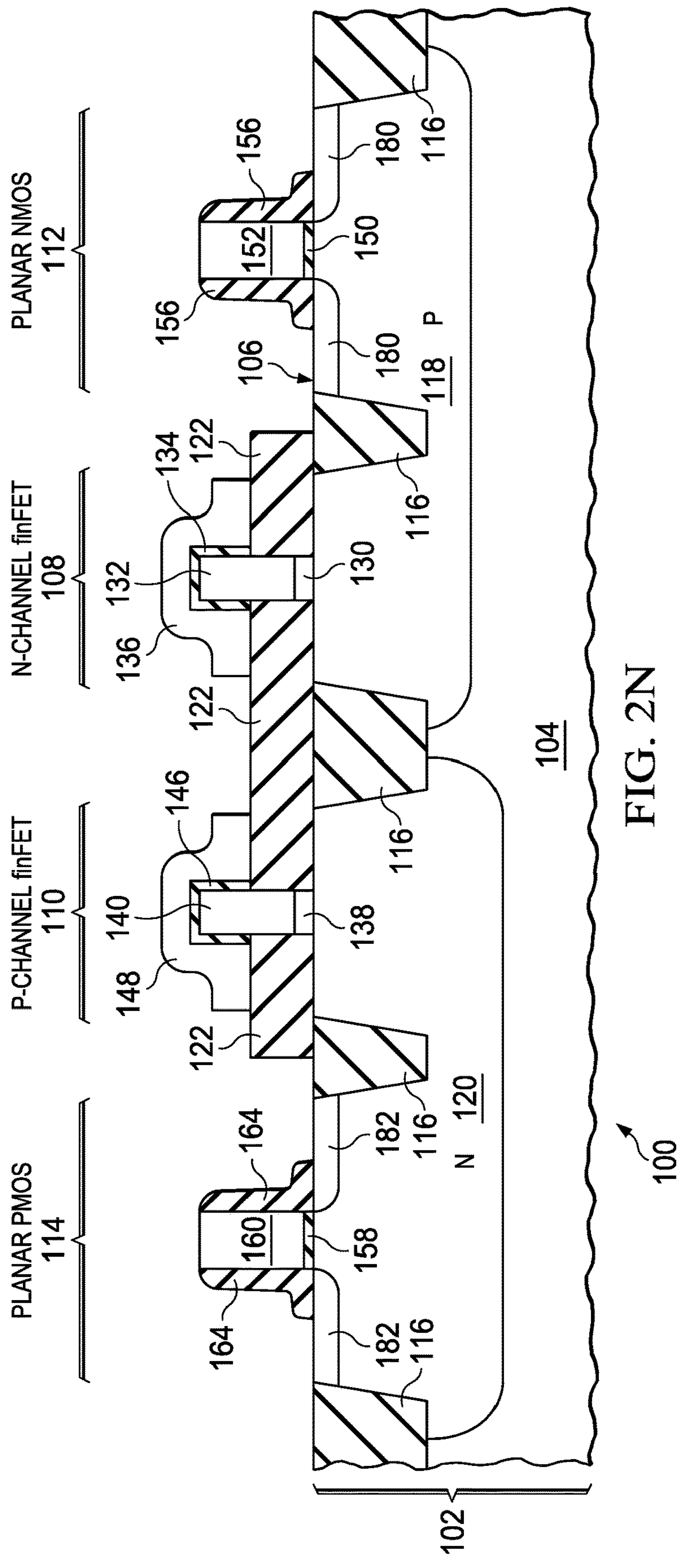
Figure 2O:
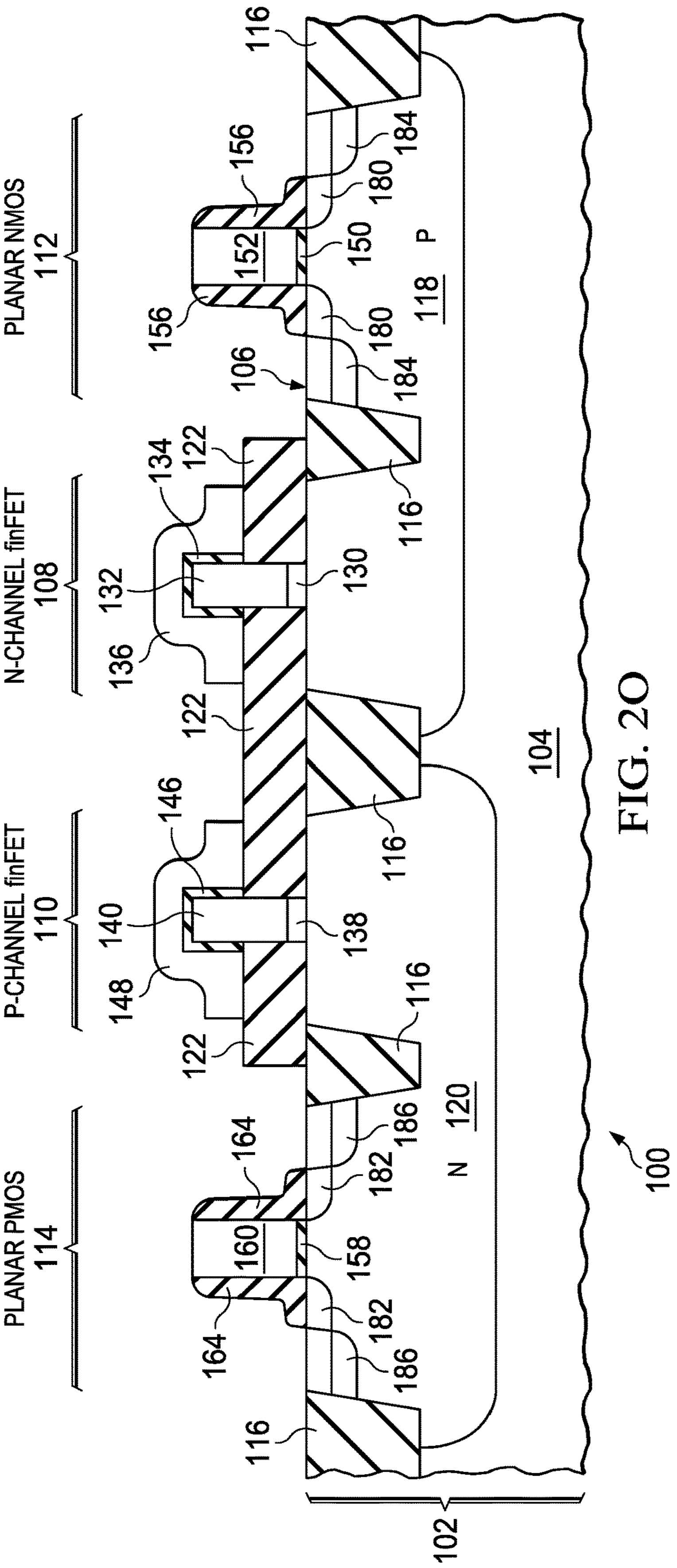

FIG. 2A through FIG. 2O are cross sections of the integrated circuit of FIG. 1, depicted in successive stages of an example fabrication process sequence. Referring to FIG. 2A, formation of the integrated circuit begins with providing the substrate 102. The optional field oxide 116, if present, is formed in the substrate 102, for example by a shallow trench isolation (STI) process. The p-type region 118 and/or the n-type region 120 may be formed in the substrate 102 by implanting p-type dopants and/or n-type dopants, respectively, into the semiconductor material 104 and annealing the substrate 102 to activate the dopants.

A first hard mask 166 is formed over the substrate 102 so as to expose the substrate 102 in an area for the p-channel finFET 110 and to cover the substrate 102 in areas for the n-channel finFET 108, the planar NMOS transistor 112 and the planar PMOS transistor 114. The first hard mask 166 may be 20 nanometers to 30 nanometers thick and may include one or more layers of silicon dioxide, silicon nitride and/or silicon oxynitride. The first hard mask 166 may be formed by a plasma enhanced chemical vapor deposition (PECVD) process using tetraethyl orthosilicate, also known as tetraethoxysilane (TEOS) to form silicon dioxide and/or bis(tertiary-butylamino) silane (BTBAS) to form silicon nitride, as appropriate. A mask of photoresist may be formed over the layers of silicon dioxide, silicon nitride and/or silicon oxynitride to expose the area for the p-channel finFET 110, and the layers of silicon dioxide, silicon nitride and/or silicon oxynitride in the area for the p-channel finFET 110 may be removed by a subsequent plasma etch process. The mask of photoresist is subsequently removed.

Referring to FIG. 2B, the optional second buffer 138 may be formed by selective epitaxial growth on the n-type region 120 of the substrate 102 in the area exposed by the first hard mask 166. The second buffer 138 is grown so as not to form a significant amount of epitaxial material on the first hard mask 166. The second buffer 138 may be grown using germane and possibly silane or dichlorosilane at a pressure of less than 20 torr and a temperature of 500° C. to 650° C. A p-channel fin epitaxial layer 168 is formed by a selective epitaxial growth process on the second buffer 138 if present, or on the n-type region 120 of the substrate 102 if the second buffer 138 is not present. The p-channel fin epitaxial layer 168 is grown so as not to form a significant amount of epitaxial material on the first hard mask 166. The p-channel fin epitaxial layer 168 may be 50 nanometers to 100 nanometers thick and may include, for example, germanium or silicon-germanium with a germanium atomic fraction greater than 80 percent. The p-channel fin epitaxial layer 168 may be grown using a similar epitaxial growth process as described for the second buffer 138. The p-channel fin epitaxial layer 168 may be doped with n-type dopants during the selective epitaxial growth process to provide a desired threshold voltage for the p-channel finFET 110. Alternatively, the p-channel fin epitaxial layer 168 may be formed by a molecular beam epitaxy (MBE) process.

Referring to FIG. 2C, the first hard mask 166 of FIG. 2B is removed, leaving the second buffer 138 and the p-channel fin epitaxial layer 168 in place. The first hard mask 166 may be removed by a plasma etch using fluorine radicals that is selective to the semiconductor materials of the p-channel fin epitaxial layer 168 and the substrate 102.

Referring to FIG. 2D, a second hard mask 170 is formed over the substrate 102 and over the p-channel fin epitaxial layer 168, so as to expose the substrate 102 in the area for the n-channel finFET 108 and to cover the substrate 102 and the p-channel fin epitaxial layer 168 in the areas for the p-channel finFET 110, the planar NMOS transistor 112 and the planar PMOS transistor 114. The second hard mask 170 may have a same structure and composition as the first hard mask 166 of FIG. 2A and FIG. 2B, and may be formed by a similar process.

Referring to FIG. 2E, the first buffer 130 is formed by selective epitaxial growth on the p-type region 118 of the substrate 102 in the area exposed by the second hard mask 170. The first buffer is grown so as not to form a significant amount of epitaxial material on the second hard mask 170. The first buffer 130 may have a similar structure and composition as described for the second buffer 138, and may be formed by a similar process. An n-channel fin epitaxial layer 172 is formed by a selective epitaxial growth process on the first buffer 130. The first buffer 130 advantageously facilitates epitaxial growth of the semiconductor material of the n-channel fin epitaxial layer 172, which would be problematic to grow directly on the substrate 102. The n-channel fin epitaxial layer 172 is grown so as not to form a significant amount of epitaxial material on the second hard mask 170. The n-channel fin epitaxial layer may be 50 nanometers to 100 nanometers thick. In a version of the instant example in which the n-channel fin epitaxial layer 172 is primarily indium gallium arsenide, the epitaxial process may use trimethyl indium, trimethyl gallium or triethyl gallium, and arsine at a pressure of 150 torr and a temperature of 750° C. to 850° C. A ratio of the trimethyl indium to the trimethyl gallium may be varied to obtain a desired ratio of indium to gallium in the n-channel fin epitaxial layer 172. In a version of the instant example in which the n-channel fin epitaxial layer 172 is primarily gallium arsenide, the epitaxial process may use trimethyl gallium or triethyl gallium and arsine. In a version of the instant example in which the n-channel fin epitaxial layer 172 is primarily indium phosphide, the epitaxial process may use trimethyl indium and phosphine. In a version of the instant example in which the n-channel fin epitaxial layer 172 is primarily germanium, the epitaxial process may use germane. In a version of the instant example in which the n-channel fin epitaxial layer 172 is primarily silicon-germanium, the epitaxial process may use silane or dichlorosilane and germane. Alternatively, the n-channel fin epitaxial layer 172 may be formed by an MBE process.

Referring to FIG. 2F, the second hard mask 170 of FIG. 2E is removed, leaving the first buffer 130, the n-channel fin epitaxial layer 172, the second buffer 138 and the p-channel fin epitaxial layer 168 in place. The second hard mask 170 may be removed by a similar process to that described for removing the first hard mask 166 in reference to FIG. 2C.

Referring to FIG. 2G, a fin mask 174 is formed over the n-channel fin epitaxial layer 172 and the p-channel fin epitaxial layer 168 so as to cover area for the n-channel fin 132 and the p-channel fin 140 of FIG. 1, respectively. The fin mask 174 may optionally cover the areas for the planar NMOS transistor 112 and the planar PMOS transistor 114, as shown in FIG. 2G, to protect the substrate 102 during a subsequent etch process.

Referring to FIG. 2H, a fin etch process removes semiconductor material from the n-channel fin epitaxial layer 172, the p-channel fin epitaxial layer 168, the first buffer 130 and the second buffer 138 in areas exposed by the fin mask 174 to leave the n-channel fin 132 and the p-channel fin 140 on the first buffer 130 and the second buffer 138, respectively. The fin etch process may be a reactive ion etch (RIE) process using fluorine radicals. The fin mask 174 is subsequently removed, for example by an ash process followed by a wet clean process using an aqueous mixture of ammonium hydroxide and hydrogen peroxide. Forming the n-channel fin 132 and the p-channel fin 140 with separate buffers, as described in the instant example, advantageously provides process latitude for fabrication of the integrated circuit 100 which may provide a desired level of yield and reliability.

Referring to FIG. 2I, a layer of isolation dielectric material 176 is formed over the substrate 102, covering the n-channel fin 132 and the p-channel fin 140. The layer of isolation dielectric material 176 may be primarily silicon dioxide and/or BPSG. The layer of isolation dielectric material 176 may optionally include other dielectric material such as silicon oxynitride.

Referring to FIG. 2J, the layer of isolation dielectric material 176 is planarized down to the n-channel fin 132 and the p-channel fin 140. The layer of isolation dielectric material 176 may be planarized by a chemical mechanical polish (CMP) process 178 as depicted schematically in FIG. 2J. Alternatively, the layer of isolation dielectric material 176 may be planarized by a resist etchback (REB) process in which a layer of organic resin such as photoresist is spin coated over the layer of isolation dielectric material 176 to provide a planar top surface. An REB plasma etch process subsequently removes the layer of organic resin and a top portion of the layer of isolation dielectric material 176. Etch rates of the layer of organic resin and the layer of isolation dielectric material 176 by the REB plasma etch process are selected to provide a desired planarity of the layer of isolation dielectric material 176.

Referring to FIG. 2K, the layer of isolation dielectric material 176 of FIG. 2J is recessed by an isotropic etch so as to expose the n-channel fin 132 and the p-channel fin 140. The recessed layer of isolation dielectric material 176 provides the isolation dielectric layer 122. The isotropic etch to recess the layer of isolation dielectric material 176 may be an isotropic plasma etch using fluorine radicals which does not significantly etch the semiconductor material of the n-channel fin 132 and the p-channel fin 140.

Referring to FIG. 2L, the isolation dielectric layer 122 may be patterned so as to expose the areas for the planar NMOS transistor 112 and the planar PMOS transistor 114. The isolation dielectric layer 122 may be patterned by forming a mask of photoresist over the isolation dielectric layer 122 and the n-channel fin 132 and the p-channel fin 140 so as to expose the areas for the planar NMOS transistor 112 and the planar PMOS transistor 114. The isolation dielectric layer 122 in the areas exposed by the mask may be removed by a timed wet etch using an dilute buffered aqueous solution of hydrofluoric acid. Alternatively, the isolation dielectric layer 122 may be removed by a plasma etch with endpoint detection based on exposure of the substrate 102. The mask is subsequently removed.

Referring to FIG. 2M, the first gate dielectric layer 134 is formed over the n-channel fin 132, and the second gate dielectric layer 146 is formed over the p-channel fin 140. The first gate dielectric layer 134 and the second gate dielectric layer 146 may be formed concurrently. The first gate 136 is formed over the first gate dielectric layer 134, and the second gate 148 is formed over the second gate dielectric layer 146. Portions of the first gate 136 and the second gate 148 may be formed concurrently. The first gate 136 has a work function appropriate for an n-channel transistor and the second gate 148 has a work function appropriate for a p-channel transistor.

Referring to FIG. 2N, if the optional planar NMOS transistor 112 and the optional planar PMOS transistor 114 are to be formed, the third gate dielectric layer 150 and the fourth gate dielectric layer 158 are formed over the substrate in the areas for the planar NMOS transistor 112 and the planar PMOS transistor 114, respectively. The third gate dielectric layer 150 and the fourth gate dielectric layer 158 may be formed concurrently. The third gate dielectric layer 150 and the fourth gate dielectric layer 158 may be thicker than the first gate dielectric layer 134 and the second gate dielectric layer 146 so that the planar NMOS transistor 112 and the planar PMOS transistor 114 may operate at a higher voltage than the n-channel finFET 108 and the p-channel finFET 110.

The NMOS gate 152 is formed over the third gate dielectric layer 150 and the PMOS gate 160 is formed over the fourth gate dielectric layer 158. Portions of the NMOS gate 152 and the PMOS gate 160 may be formed concurrently. After the NMOS gate 152 and the PMOS gate 160 are formed, n-type drain extensions 180 are formed in the substrate 102 adjacent to, and extending partway under, the NMOS gate 152, by implanting n-type dopants such as phosphorus and arsenic, and p-type drain extensions 182 are formed in the substrate 102 adjacent to, and extending partway under, the PMOS gate 160, by implanting p-type dopants such as boron. The substrate 102 is annealed after the n-type dopants and p-type dopants are implanted to activate the n-type dopants and p-type dopants, possibly by a laser anneal. Subsequently, the sidewall spacers 156 and 164 are formed adjacent to the NMOS gate 152 and the PMOS gate 160, respectively.

Referring to FIG. 2O, n-type source/drain implanted regions 184 are formed in the substrate 102 adjacent to the sidewall spacers 156 adjacent to the NMOS gate 152, by implanting n-type dopants. P-type source/drain implanted regions 186 are formed in the substrate 102 adjacent to the sidewall spacers 164 adjacent to the PMOS gate 160, by implanting p-type dopants. N-type source/drain implanted regions of the n-channel finFET 108 may be formed concurrently with the n-type source/drain implanted regions 184 of the planar NMOS transistor 112. Similarly, p-type source/drain implanted regions of the p-channel finFET 110 may be formed concurrently with the p-type source/drain implanted regions 186 of the planar PMOS transistor 114. The substrate is anneals to activate the implanted n-type dopants and p-type dopants in the n-type source/drain implanted regions 184 of the planar NMOS transistor 112, the p-type source/drain implanted regions 186 of the planar PMOS transistor 114, the n-type source/drain implanted regions of the n-channel finFET 108 and the p-type source/drain implanted regions of the p-channel finFET 110, to provide the structure of FIG. 1.

The structure of FIG. 1 may also be obtained by a process sequence analogous to that described in reference to FIG. 2A through FIG. 2O, in which the first hard mask exposes the area for the n-channel finFET and the second hard mask exposes the area for the p-channel finFET. In such a process sequence, the n-channel fin epitaxial layer is formed before the p-channel fin epitaxial layer.

Figure 3A:
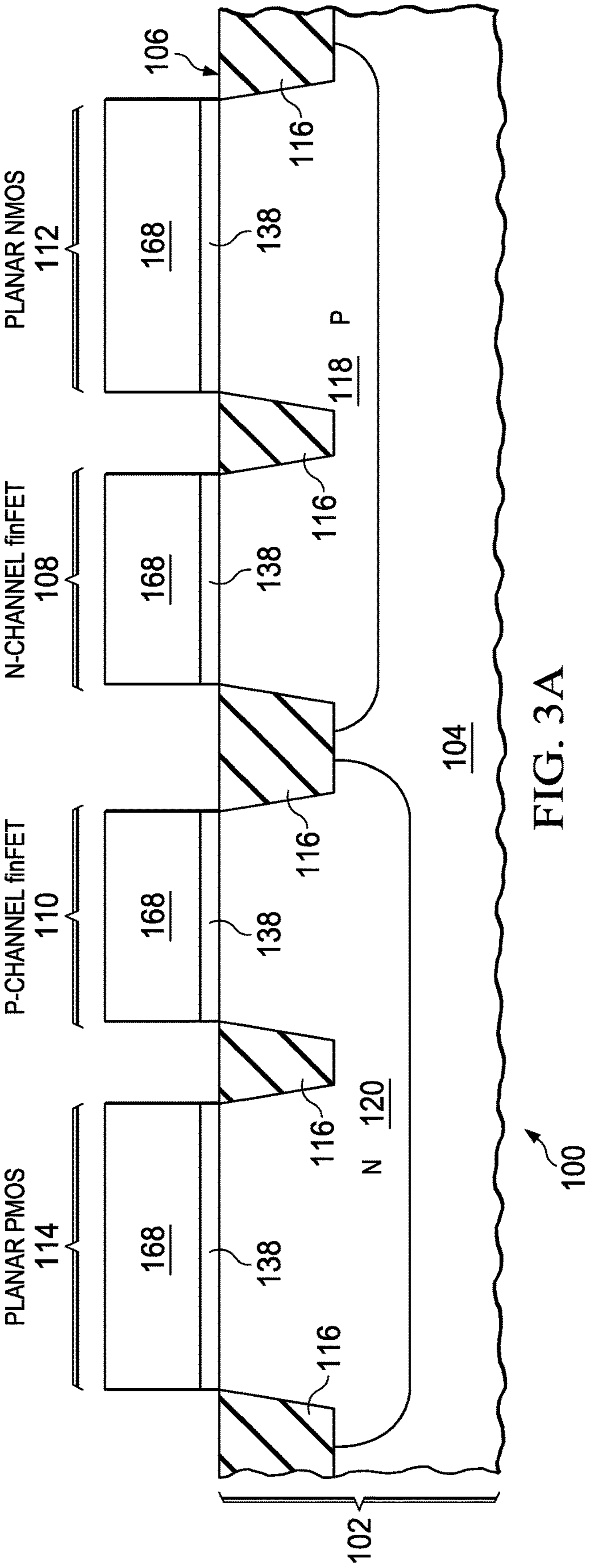
FIG. 3A through FIG. 3H are cross sections of the integrated circuit of FIG. 1, depicted in successive stages of another example fabrication process sequence.

FIG. 3A through FIG. 3H are cross sections of the integrated circuit of FIG. 1, depicted in successive stages of another example fabrication process sequence. Referring to FIG. 3A, formation of the integrated circuit 100 is performed as described in reference to FIG. 2A, through formation of the optional field oxide 116, the p-type region 118 and/or the n-type region 120. The second buffer 138 is formed by selective epitaxial growth on exposed areas of the semiconductor material 104 of the substrate 102, including the areas for the n-channel finFET 108, the p-channel finFET 110, the planar NMOS transistor 112 and the planar PMOS transistor 114. The process to grow the second buffer 138 may be as described in reference to FIG. 2B. The p-channel fin epitaxial layer 168 is formed by a selective epitaxial growth process on the second buffer 138. The p-channel fin epitaxial layer 168 may be grown as described in reference to FIG. 2B. Alternatively, the second buffer 138 and the p-channel fin epitaxial layer 168 may be formed by an MBE process.

Figure 3B:
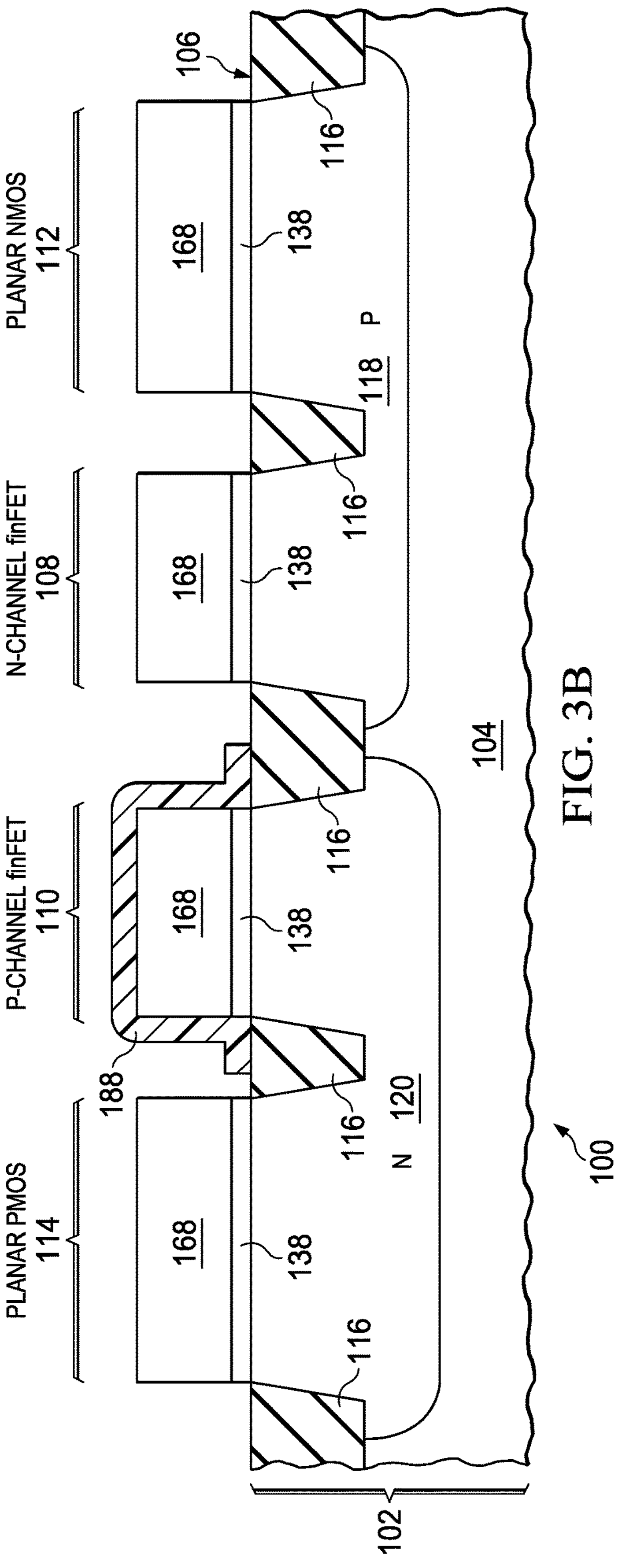

Referring to FIG. 3B, a hard mask 188 is formed over the p-channel fin epitaxial layer 168 in the area for the p-channel finFET 110, and is patterned so as to expose the p-channel fin epitaxial layer 168 in the areas for the n-channel finFET 108, the planar NMOS transistor 112 and the planar PMOS transistor 114. The hard mask 188 may have the same structure and composition as the second hard mask 170 of FIG. 2D.

Figure 3C:
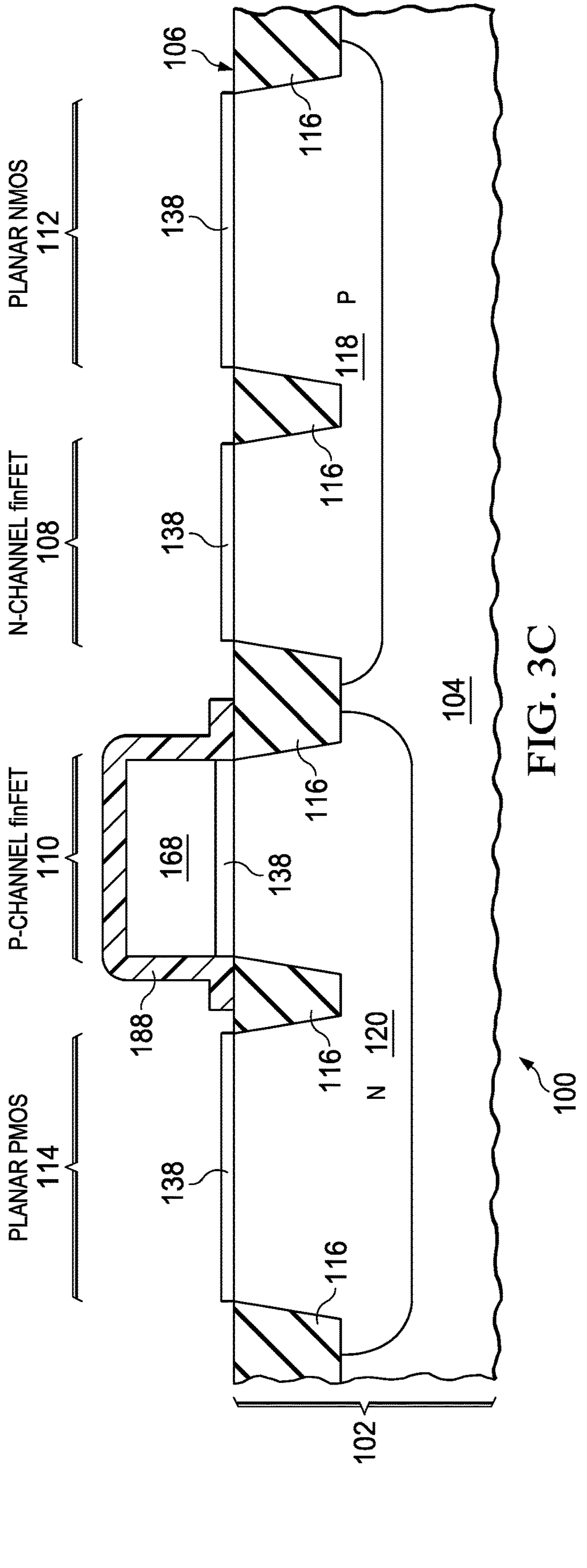

Referring to FIG. 3C, the p-channel fin epitaxial layer 168 is removed in areas exposed by the hard mask 188, leaving a portion of the second buffer 138 in the area for the n-channel finFET 108. The p-channel fin epitaxial layer 168 may be removed, for example, by a timed wet etch using a dilute buffered aqueous solution of hydrofluoric acid. Alternatively, the p-channel fin epitaxial layer 168 may be removed by a plasma etch using fluorine radicals.

Figure 3D:
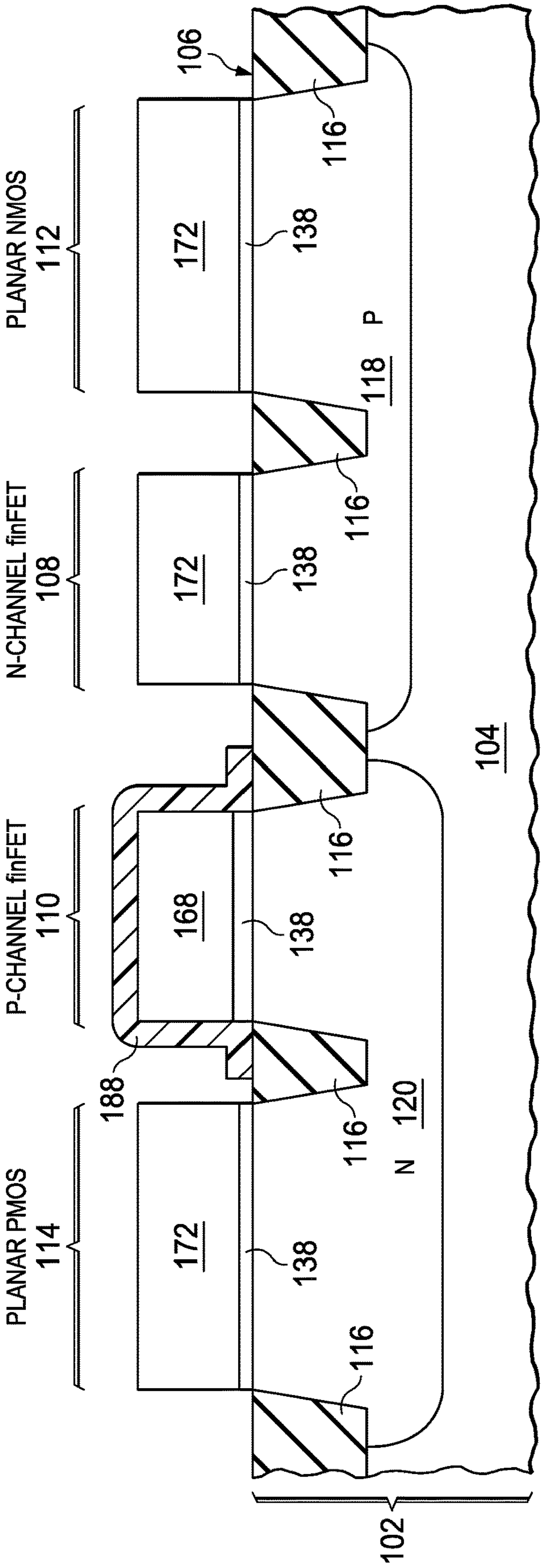

Referring to FIG. 3D, the n-channel fin epitaxial layer 172 is formed by a selective epitaxial growth process on the portion of the second buffer 138 in the area for the n-channel finFET 108, and on any other portions of the second buffer 138, for example in the areas for the planar NMOS transistor 112 and the planar PMOS transistor 114, as shown in FIG. 3D. The n-channel fin epitaxial layer 172 is grown so as not to form a significant amount of epitaxial material on the hard mask 188.

Figure 3E:
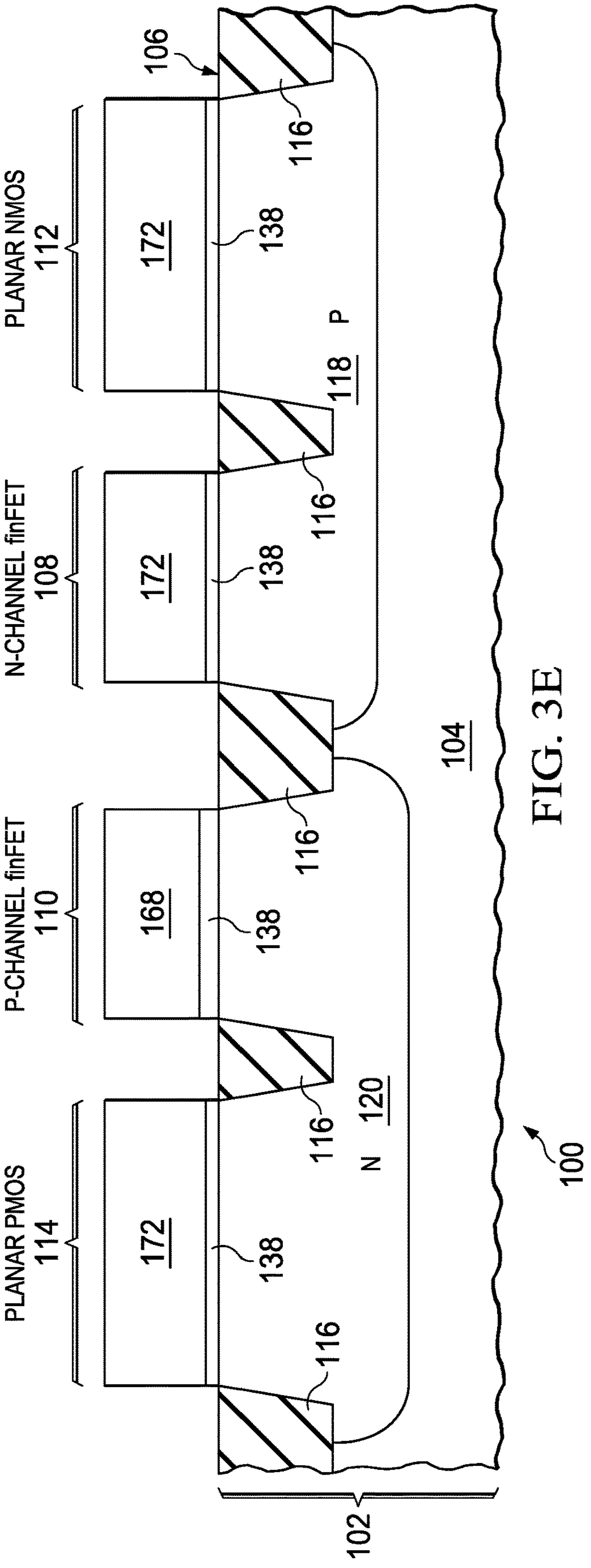

Referring to FIG. 3E, the hard mask 188 of FIG. 3D is removed, leaving the n-channel fin epitaxial layer 172 and the p-channel fin epitaxial layer 168 in place on the second buffer 138. The hard mask 188 may be removed by a similar process to that described for removing the first hard mask 166 in reference to FIG. 2C.

Figure 3F:
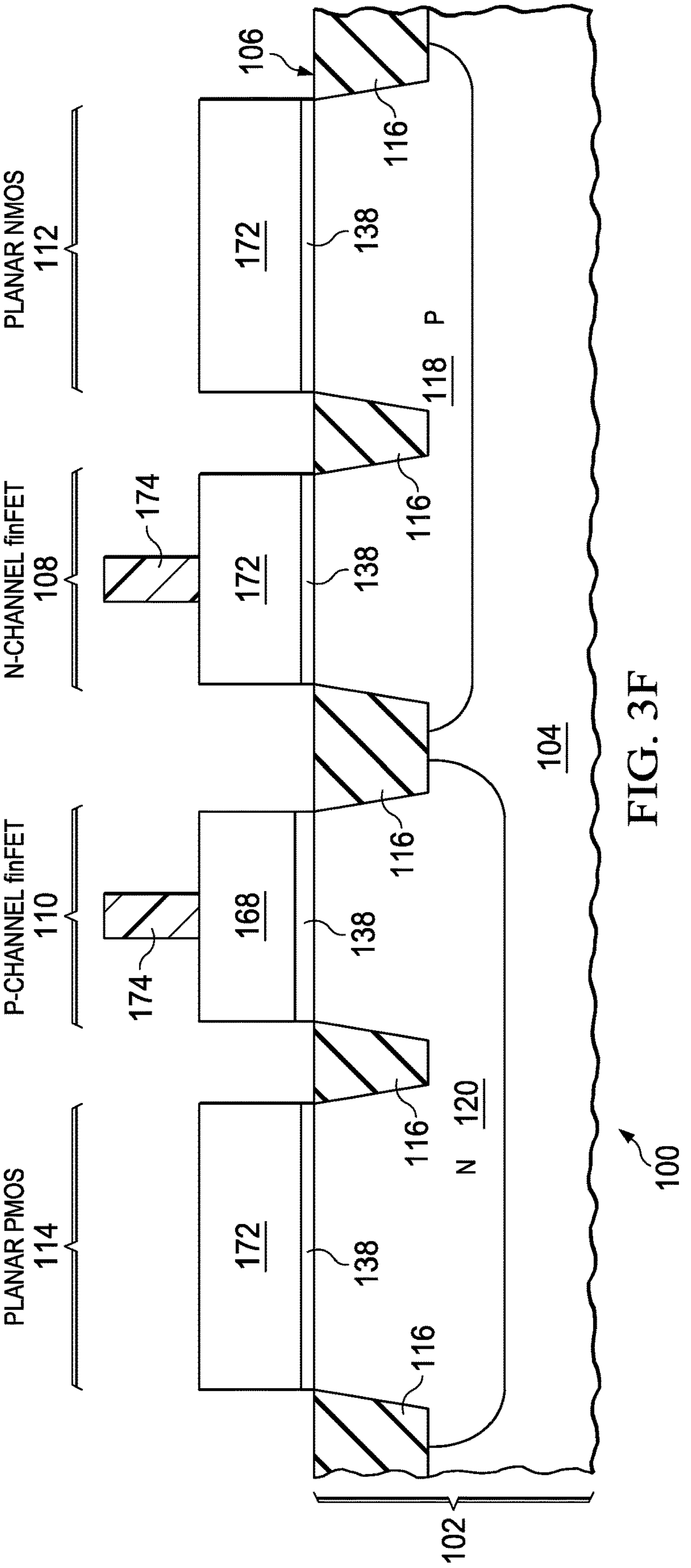

Referring to FIG. 3F, the fin mask 174 is formed over the n-channel fin epitaxial layer 172 and the p-channel fin epitaxial layer 168 so as to cover area for the n-channel fin 132 and the p-channel fin 140 of FIG. 1, respectively. In the instant example, the fin mask 174 exposes the areas for the planar NMOS transistor 112 and the planar PMOS transistor 114 to enable removal of any the n-channel fin epitaxial layer 172 and any second buffer 138 in these areas.

Figure 3G:
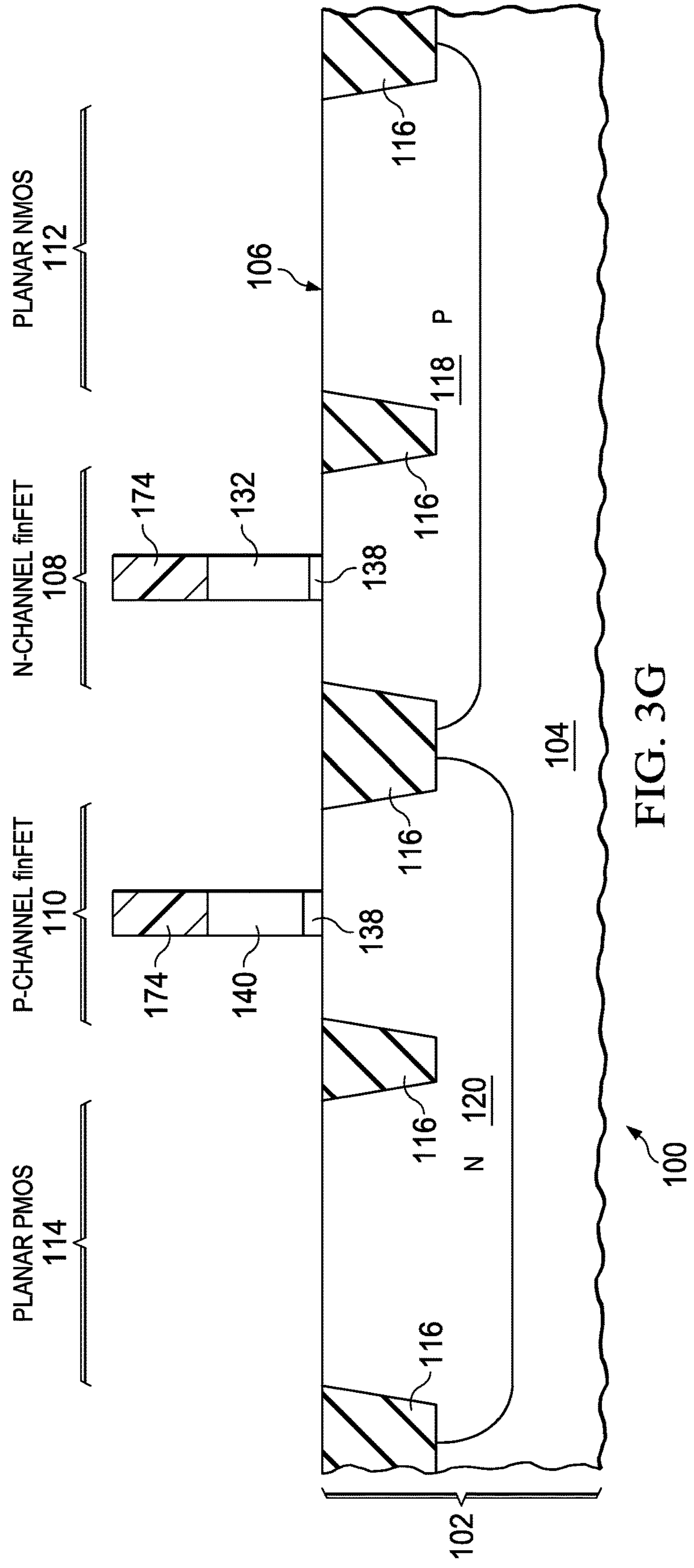

Referring to FIG. 3G, a fin etch process removes semiconductor material from the n-channel fin epitaxial layer 172, the p-channel fin epitaxial layer 168, the first buffer 130 and the second buffer 138 in areas exposed by the fin mask 174 to leave the n-channel fin 132 and the p-channel fin 140 on the first buffer 130 and the second buffer 138, respectively. In the instant example, the fin etch process removes any remaining n-channel fin epitaxial layer 172 and any second buffer 138 from the areas for the planar NMOS transistor 112 and the planar PMOS transistor 114.

Figure 3H:
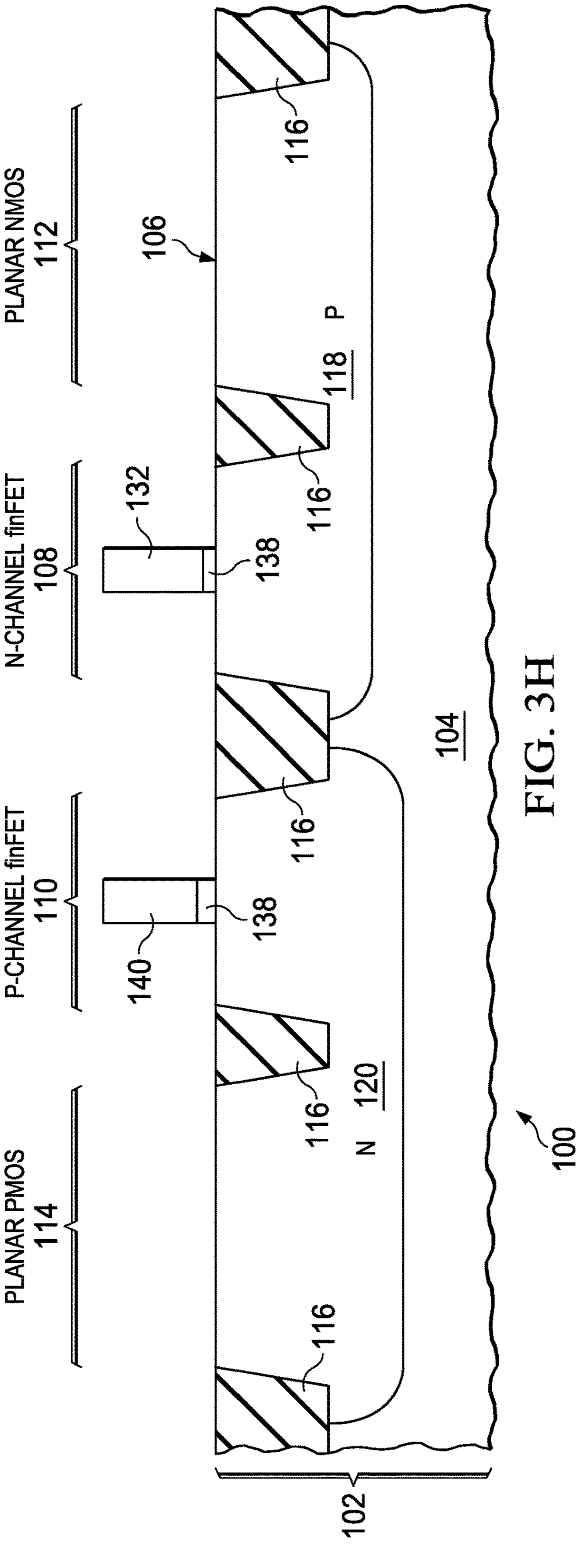

Referring to FIG. 3H, the fin mask 174 is subsequently removed, for example as described in reference to FIG. 2H. Forming the n-channel fin 132 and the p-channel fin 140 as described in the instant example eliminates one hard mask and a corresponding pattern step, which may advantageously reduce a fabrication cost and complexity of the integrated circuit 100. Processing of the integrated circuit 100 is continued as described in reference to FIG. 2I through FIG. 2O to provide the structure of FIG. 1.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
a semiconductor substrate;
an n-channel fin field effect transistor (finFET) comprising:
an n-channel fin disposed over the semiconductor substrate, the n-channel fin including a III-V semiconductor material;
a first gate dielectric layer disposed on the n-channel fin; and
a first gate disposed on the first gate dielectric layer;
a p-channel finFET adjacent to the n-channel finFET and comprising:
a p-channel fin disposed over the semiconductor substrate, the p-channel fin comprising silicon-germanium;
a second gate dielectric layer disposed on the p-channel fin; and
a second gate disposed on the second gate dielectric layer;
a field oxide in the semiconductor substrate, the field oxide disposed between the n-channel finFET and the p-channel finFET, the field oxide comprising a top surface; and
an isolation dielectric layer disposed partially on the semiconductor substrate between the n-channel finFET and the p-channel finFET and partially on the top surface of the field oxide between the n-channel finFET and the p-channel finFET, the isolation dielectric layer abutting the n-channel fin and the p-channel fin.

2. The integrated circuit of claim 1, wherein the III-V semiconductor material of the n-channel fin comprises indium gallium arsenide.

3. The integrated circuit of claim 1, further comprising:
a buffer layer disposed between the p-channel fin and the semiconductor substrate, the buffer layer comprising germanium.

4. The integrated circuit of claim 1, further comprising:
a buffer layer disposed between the n-channel fin and the semiconductor substrate, the buffer layer comprising germanium.

5. The integrated circuit of claim 1, further comprising:
first and second field oxide isolation structures in the semiconductor substrate; and
a planar NMOS transistor and a planar PMOS transistor disposed in the semiconductor substrate, wherein the planar NMOS transistor is laterally separated from the n-channel finFET by the first field oxide isolation structure and the planar PMOS transistor is laterally separated from the p-channel finFET by the second field oxide isolation structure.

6. The integrated circuit of claim 5, wherein:
the planar NMOS transistor and the n-channel finFET are located in a p-type well in the semiconductor substrate; and
the planar PMOS transistor and the p-channel finFET are located in a n-type well in the semiconductor substrate.

7. An integrated circuit, comprising:
a silicon substrate;
an n-channel fin field effect transistor (finFET) having an n-channel fin over the silicon substrate, the n-channel fin comprising a III-V semiconductor material;
a p-channel finFET adjacent to the n-channel finFET and having a p-channel fin over the silicon substrate, the p-channel fin comprising silicon-germanium;
a field oxide in the silicon substrate, the field oxide disposed between the n-channel finFET and the p-channel finFET, the field oxide comprising a top surface; and
an isolation dielectric layer disposed partially on the silicon substrate between the n-channel finFET and the p-channel finFET and partially on the top surface of the field oxide between the n-channel finFET and the p-channel finFET, the isolation dielectric layer abutting the n-channel fin and the p-channel fin, wherein the n-channel fin and the p-channel fin extend above the isolation dielectric layer.

8. The integrated circuit of claim 7, wherein:

the n-channel fin comprises a first buffer disposed on the silicon substrate between the silicon substrate and the III-V semiconductor material, the first buffer comprising germanium and the III-V semiconductor material comprising gallium arsenide (GaAs);

the n-channel finFET further comprises:

a first gate dielectric layer disposed on the n-channel fin; and a first gate disposed on the first gate dielectric layer; and the p-channel finFET further comprises:

a second gate dielectric layer disposed on the p-channel fin; and a second gate disposed on the second gate dielectric layer.

9. The integrated circuit of claim 7, wherein the III-V semiconductor material of the n-channel fin comprises indium gallium arsenide.

10. The integrated circuit of claim 8, wherein the p-channel fin further comprises a second buffer disposed on the silicon substrate, the second buffer comprising germanium.

11. The integrated circuit of claim 8, wherein a germanium atomic fraction of the first buffer is graded.

12. The integrated circuit of claim 7, further comprising:

a planar NMOS transistor and a planar PMOS transistor disposed in the silicon substrate, wherein the planar NMOS transistor is laterally separated from the n-channel finFET by a first field oxide isolation structure and the planar PMOS transistor is laterally separated from the p-channel finFET by a second field oxide isolation structure.

13. The integrated circuit of claim 12, wherein:

the planar NMOS transistor and the n-channel finFET are located in a p-type well in the silicon substrate; and the planar PMOS transistor and the p-channel finFET are located in a n-type well in the silicon substrate.

14. The integrated circuit of claim 7, further comprising:

a planar NMOS transistor and a planar PMOS transistor disposed in the silicon substrate, wherein:

the planar NMOS transistor and the n-channel finFET are located in a p-type well in the silicon substrate; and the planar PMOS transistor and the p-channel finFET are located in a n-type well in the silicon substrate.

15. A semiconductor structure, comprising:

a silicon substrate;

an n-channel fin field effect transistor (finFET) comprising:

an n-channel fin disposed over the silicon substrate, the n-channel fin including a III-V semiconductor material;

a first gate dielectric layer disposed on the n-channel fin; and a first gate disposed on the first gate dielectric layer;

a p-channel finFET adjacent to the n-channel finFET and comprising:

a p-channel fin disposed over the silicon substrate the p-channel fin including silicon-germanium;

a second gate dielectric layer disposed on the p-channel fin; and a second gate disposed on the second gate dielectric layer;

a field oxide in the silicon substrate, the field oxide disposed between the n-channel finFET and the p-channel finFET, the field oxide comprising a top surface; and an isolation dielectric layer disposed partially on the silicon substrate between the n-channel finFET and the p-channel finFET and partially on the top surface of the field oxide between the n-channel finFET and the p-channel finFET, the isolation dielectric layer abutting the n-channel fin and the p-channel fin.

16. The semiconductor structure of claim 15, wherein the III-V semiconductor material comprises gallium arsenide.

17. The semiconductor structure of claim 15, wherein the III-V semiconductor material comprises indium gallium arsenide.

18. The semiconductor structure of claim 15, wherein the n-channel fin and the p-channel fin extend above the isolation dielectric layer.

19. The semiconductor structure of claim 15, further comprising:

a planar n-channel metal oxide semiconductor (NMOS) transistor on the silicon substrate; and a planar p-channel metal oxide semiconductor (PMOS) transistor on the silicon substrate.

20. The semiconductor structure of claim 19, wherein:

the planar NMOS transistor and the n-channel finFET are located in a p-type well in the silicon substrate; and the planar PMOS transistor and the p-channel finFET are located in a n-type well in the silicon substrate.

21. The semiconductor structure of claim 15, further comprising:

a buffer layer disposed between the n-channel fin and the silicon substrate, the buffer layer comprising germanium.

22. The integrated circuit of claim 1, wherein the n-channel fin and the p-channel fin extend above the isolation dielectric layer.

* * * * *